US012742073B2

(12) United States Patent
Choi et al.

(10) Patent No.: US 12,742,073 B2
(45) Date of Patent: Sep. 22, 2026

(54) ANTIREFLECTIVE COATING POLYMERIC FILM FOR PHOTOELECTRIC DEVICE AND PHOTOELECTRIC DEVICE COMPRISING THE SAME

(71) Applicants: UNIST (ULSAN NATIONAL INSTITUTE OF SCIENCE AND TECHNOLOGY), Ulsan (KR); University of Pittsburgh—Of the Commonwealth System of Higher Education, Pittsburgh, PA (US)

(72) Inventors: Kyoung Jin Choi, Suwon-si (KR); Chan Ul Kim, Seoul (KR); YoungIm Noh, Seoul (KR); Jung-Kun Lee, Pittsburgh, PA (US); Seongha Lee, Pittsburgh, PA (US)

(73) Assignees: UNIST (ULSAN NATIONAL INSTITUTE OF SCIENCE AND TECHNOLOGY), Ulsan (KR); UNIVERSITY OF PITTSBURGH—OF THE COMMONWEALTH SYSTEM OF HIGHER EDUCATION, Pittsburgh, PA (US)

( * ) Notice: Subject to any disclaimer, the term of this patent is extended or adjusted under 35 U.S.C. 154(b) by 0 days.

(21) Appl. No.: 18/680,044

(22) Filed: May 31, 2024

(65) Prior Publication Data

US 2024/0400836 A1 Dec. 5, 2024

Related U.S. Application Data

(60) Provisional application No. 63/470,405, filed on Jun. 1, 2023.

(30) Foreign Application Priority Data

Jun. 23, 2023 (KR) ........................ 10-2023-0081388

(51) Int. Cl.
*C09D 5/00* (2006.01)
*C08K 3/34* (2006.01)
(Continued)

(52) U.S. Cl.
CPC ............. *C09D 5/006* (2013.01); *H10F 10/19* (2025.01); *H10F 77/315* (2025.01); *H10F 77/45* (2025.01);
(Continued)

(58) Field of Classification Search
CPC ....... C09D 5/006; H10F 77/315; H10F 77/45; H10F 77/496; H10F 10/19
See application file for complete search history.

(56) References Cited

U.S. PATENT DOCUMENTS

| | | | | |
|---|---|---|---|---|
| 8,941,001 | B1 * | 1/2015 | Basel | H10F 77/1696 136/256 |
| 2012/0132930 | A1 * | 5/2012 | Young | H05K 1/0313 257/E31.127 |
| 2015/0053259 | A1 * | 2/2015 | Hardin | H10F 77/12 438/505 |

FOREIGN PATENT DOCUMENTS

| | | | |
|---|---|---|---|
| CN | 203932070 | U * | 11/2014 |
| JP | 2013157560 | A | 8/2013 |
| WO | 2019065421 | A1 | 4/2019 |

OTHER PUBLICATIONS

English machine translation of CN203932070U. (Year: 2014).*
(Continued)

*Primary Examiner* — Lindsey A Buck
(74) *Attorney, Agent, or Firm* — Hoffman Warnick LLC

(57) ABSTRACT

The present disclosure relates to a polymeric antireflective coating film for a photoelectric device and a method of manufacturing the same. More specifically, the polymeric antireflective coating film includes a transparent polymer; and micro phosphor particles and oxide nanoparticles,
(Continued)

wherein a textured surface of a three-dimensional (3D) structure is included on at least one surface thereof.

14 Claims, 26 Drawing Sheets

(51) Int. Cl.

| | |
|---|---|
| ***C08K 3/36*** | (2006.01) |
| ***C09D 7/61*** | (2018.01) |
| ***C09D 183/04*** | (2006.01) |
| ***C09K 11/59*** | (2006.01) |
| ***H10F 10/19*** | (2025.01) |
| ***H10F 77/30*** | (2025.01) |
| ***H10F 77/40*** | (2025.01) |
| ***H10F 77/45*** | (2025.01) |

(52) U.S. Cl.
CPC ............ *H10F 77/496* (2025.01); *C08K 3/34* (2013.01); *C08K 3/36* (2013.01); *C08K 2201/005* (2013.01); *C09D 7/61* (2018.01); *C09D 183/04* (2013.01); *C09K 11/59* (2013.01)

(56) References Cited

OTHER PUBLICATIONS

Lee et al., “Improving Light Absorption in a Perovskite/Si Tandem Solar Cell via Light Scattering and UV-Down Shifting by a Mixture of SiO2 Nanoparticles and Phosphors,” Advanced Functional Materials, vol. 32, Issue 35, 10 pages.

* cited by examiner

| | R | F |
|---|---|---|
| Jsc ($mA/cm^2$) | 16.74 | 16.72 |
| $V_{oc}$ (V) | 1.75 | 1.75 |
| FF (%) | 80.21 | 80.18 |
| Efficiency (%) | 23.50 | 23.46 |

ANTIREFLECTIVE COATING POLYMERIC FILM FOR PHOTOELECTRIC DEVICE AND PHOTOELECTRIC DEVICE COMPRISING THE SAME

TECHNICAL FIELD

The following description relates to a polymeric antireflective coating film for a photoelectric device and the photoelectric device including the polymeric antireflective coating film.

DESCRIPTION OF RELATED ART

A multi-junction solar cell may have a power conversion efficiency (PCE) exceeding that of a single-junction solar cell. Among various types of multi-junction solar cell, a perovskite/silicon (Si) tandem solar cell may have commercial potential due to its economic advantages. For the perovskite/Si tandem solar cell, designing an effective optical path of a tandem cell may be an essential factor. The optical design is to minimize a reflection loss of light in a visible region and to reduce the parasitic absorption of light especially in an ultraviolet (UV) region. In general, when light is incident on a perovskite cell on top of a tandem structure, about 18.4% of the incident light may be lost by reflection at an air-perovskite cell interface due to a refractive index difference (e.g., $n_{air}\approx 1$ and $n_{perovskite}\approx 2.5$).

To reduce such a surface reflection, a polymeric antireflective coating (ARC), i.e., a textured poly(dimethylsiloxane) (PDMS) ($n_{PDMS}\approx 1.39$) film, may often be disposed on top of a transparent conductive oxide (TCO). The textured PDMS film may have a problem in that it only uses multiple internal scattering and the refractive index of PDMS is not between air and TCO. In addition to the surface reflectance loss, parasitic absorption in a wavelength range of 300 nanometers (nm) to 1200 nm also occurs in the tandem cell. In particular, the parasitic absorption of short-wavelength light ($\lambda<500$ nm) by TCO and a buffer layer may greatly limit the absorption of UV light in the perovskite layer, which may reduce the PCE of a series device.

Although alternative transparent electrodes such as graphene and reduced graphene oxide have been introduced to increase transmittance in the UV region, they fail to completely solve the problem. Moreover, when UV light is transmitted into the perovskite layer, high-energy UV photons may accelerate the dissociation of the perovskite layer into $PbI_2$ and by-products, which may cause rapid degradation in the PCE.

DESCRIPTION OF INVENTION

Technical Goals

To solve the problem described above, the present disclosure provides an optical design for improving power conversion efficiency (PCE) in photoelectric devices and improving device stability under ultraviolet (UV) illumination.

According to an embodiment, the present disclosure is to provide a polymeric antireflective coating film that improves UV photostability in a photoelectric device through an optical operation design using phosphors and oxide nanoparticles and an optical design using the Mie scattering mechanism and maximizes further an antireflection effect to minimize an optical loss.

According to an embodiment, the present disclosure is to provide a photoelectric device having improved optical performance and efficiency (e.g., PCE) using a polymeric antireflective coating film according to embodiments of the present disclosure.

However, the technical goals obtainable from the present disclosure are not limited to those described above, and other goals not described above may also be clearly understood by one of ordinary skill in the art to which the present disclosure pertains from the following description.

Technical Solutions

According to embodiments of the present disclosure, there is provided a polymeric antireflective coating film including: a transparent polymer; and micro phosphor particles and oxide nanoparticles, wherein a textured surface of a three-dimensional (3D) structure is included on at least one side.

According to an embodiment, the transparent polymer may include at least one of polydimethylsiloxane (PDMS), polydiphenylsiloxane (PDPhS), polymethylphenylsiloxane (PMPS), ethylene-vinyl acetate copolymer (EVA), poly olefin elastomer (POE), polymethyl metacrylate (PMMA), cellulose triacetate (TAC), polyethylene terephthalate (PET), poly(ether ketone) (PEK), polymer glass, polycarbonate (PC), and polyolefin, or a combination thereof.

According to an embodiment, the 3D structure may be regularly or irregularly arranged, and the 3D structure may include at least one of a sphere, an ellipse, a cone, a polygonal pyramid, a polygonal cylinder, a polygon, and a polygonal prism, or a combination thereof.

According to an embodiment, the polymeric antireflective coating film may include a protrusion, a recess, or both by the 3D structure on the at least one side of the polymeric antireflective coating film.

According to an embodiment, a height of the protrusion and a depth of the recess may each be approximately 1 micrometer (um) to 10 um.

According to an embodiment, the micro phosphor particles and the oxide nanoparticles may be approximately 0% by weight (exceeding) to 6% by weight of the polymeric antireflective coating film.

According to an embodiment, a mass ratio of the micro phosphor particles to the oxide nanoparticles may be approximately 1:10 to 1:1.

According to an embodiment, a size of the micro phosphor particles may be approximately 1 um to 5 um.

According to an embodiment, the micro phosphor particles may include at least one of a red phosphor, a green phosphor, and a blue phosphor, or a combination thereof.

According to an embodiment, the micro phosphor particles may include at least one of a silicon-based phosphor, a nitride-based phosphor, and an oxide-based phosphor, or a combination thereof.

According to an embodiment, a size of the oxide nanoparticles may be approximately 30 nanometers (nm) to 400 nm.

According to an embodiment, the oxide nanoparticles may include an oxide particle having a light-scattering function, and the oxide nanoparticles may include a light-scattering particle including at least one of silica, titanium oxide, magnesium oxide, barium oxide, aluminum oxide, bismuth oxide, zirconium oxide, tin oxide, tungsten oxide, strontium oxide, niobium oxide, and zinc oxide, or a combination thereof.

According to an embodiment, the polymeric antireflective coating film may have a light transmittance of 90% or greater.

According to an embodiment, the polymeric antireflective coating film may have a thickness of approximately 50 um to 300 um.

According to embodiments of the present disclosure, there is provided a photoelectric device including a polymeric antireflective coating film according to embodiments of the present disclosure. The polymeric antireflective coating film may be the same one as described above.

According to an embodiment, the photoelectric device may include a perovskite solar cell, a silicon solar cell, or both.

According to an embodiment, the photoelectric device may include: a monolithic perovskite solar cell layer; and a silicon tandem solar cell layer, wherein the polymeric antireflective coating film may be comprised on the monolithic perovskite solar cell layer.

Effects of Invention

According to an embodiment, the present disclosure is to provide a polymeric antireflective coating film that improves ultraviolet (UV) photostability in a photoelectric device and maximizes further an antireflection effect to minimize an optical loss.

According to an embodiment, the present disclosure is to provide a photoelectric device having improved optical performance and efficiency (e.g., power conversion efficiency (PCE)) using a polymeric antireflective coating film according to embodiments of the present disclosure.

BRIEF DESCRIPTION OF THE DRAWINGS

According to an embodiment.

According to an embodiment.

According to an embodiment.

According to an embodiment.

According to an embodiment.

According to an embodiment.

According to an embodiment.

DETAILED DESCRIPTION

Figure 1A:
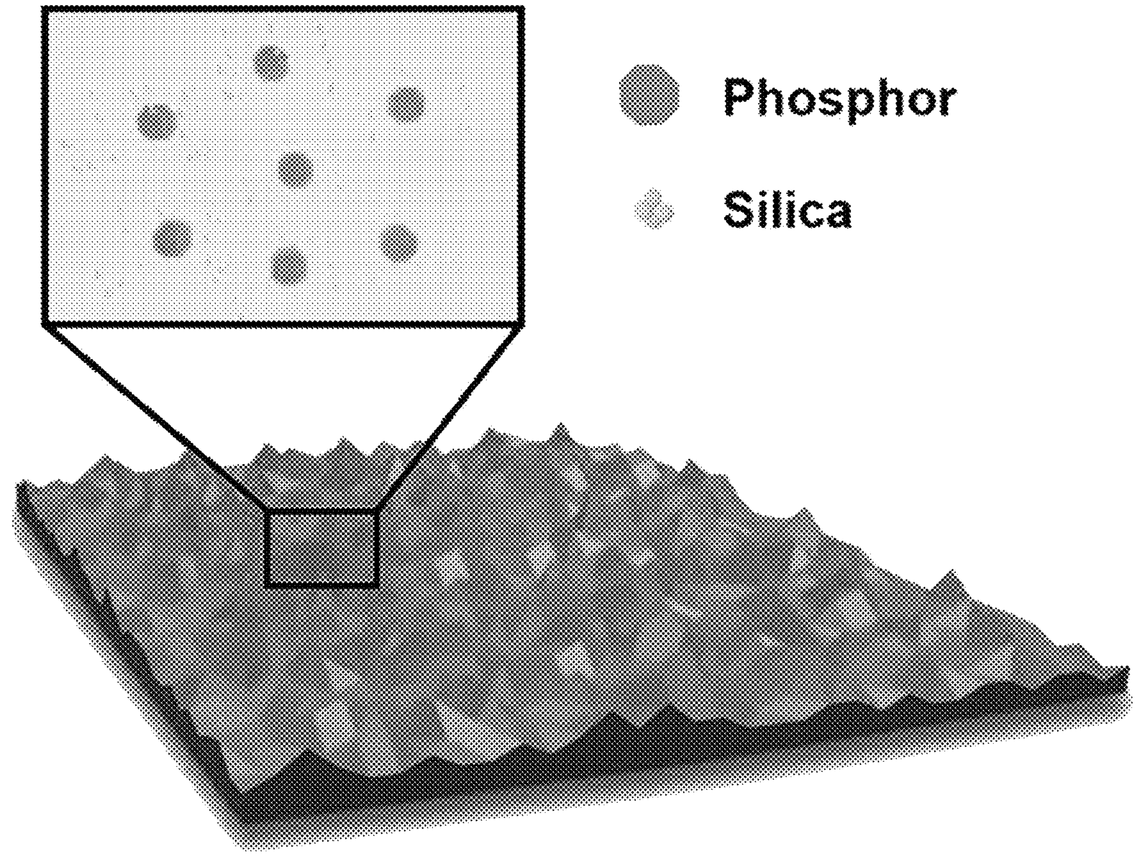
FIG. 1A is a schematic diagram showing a polymeric antireflective coating film (or ARC film) (e.g., a polydimethylsiloxane (PDMS) layer) including a phosphor (e.g., SGA phosphor) and oxide nanoparticles (e.g., $SiO_2$ nanoparticles).

Hereinafter, embodiments of the present disclosure will be described in detail with reference to the accompanying drawings. In the description of the present disclosure, detailed description of well-known related functions or configurations will be omitted when it is deemed that such description will cause ambiguous interpretation of the present disclosure. In addition, the terminologies used herein are for the purpose of appropriately describing embodiments of the present disclosure and may vary depending on the intention of users or operators or customs in the art to which the present disclosure pertains. Therefore, terms used herein should be defined based on the content throughout the present specification. In the drawings, like reference numerals are used for like elements.

Throughout the present specification, when one member is disposed or positioned "on" another member, this not only includes a case that the one member is brought into contact with the other member, but also includes a case that another member is present between the two members.

Throughout the present specification, it is to be understood that, when one part "includes" or "comprises" a component, the part does not exclude another component but may further include the other component.

Hereinafter, a polymeric antireflective coating film and a photoelectric device including the polymeric antireflective coating film according to the present disclosure will be described in detail with reference to example embodiments and drawings. However, the present disclosure is not limited to the embodiments and the drawings.

According to an embodiment, the polymeric antireflective coating film may include a transparent polymer; and phosphors and oxide nanoparticles. According to an embodiment, the polymeric antireflective coating film may include a textured surface on at least a portion of at least one side or over the entire surface of the polymeric antireflective coating film.

According to an embodiment, in the polymeric antireflective coating film, the optical properties of the textured polymeric antireflective coating film may be associated with an optical design in which a down-conversion effect of phosphor particles and a multi-scattering effect of oxide nanoparticles (e.g., $SiO_2$) are combined. That is, to solve the parasitic absorption of ultraviolet (UV) light, a phosphor may be introduced to convert the UV light into visible light. Furthermore, a micro-size (e.g., >about 5 μm) and a high refractive index (e.g., n≈1.9) of the phosphors embedded in the polymeric antireflective coating film may increase the reflectance of the polymeric antireflective coating film. In addition, a backward scattering problem that may be caused by the phosphors may be supplemented by the addition of oxide nanoparticles (e.g., $SiO_2$) (e.g., in a spherical shape). That is, the oxide nanoparticles (e.g., $SiO_2$) of the polymeric antireflective coating film may increase a diffuse transmittance and accordingly reduce the reflectance. The polymeric antireflective coating film according to this optical design may successfully promote optical absorption of a photoelectric device (e.g., a perovskite/silicon (Si) tandem solar cell) and improve the optical performance and efficiency (e.g., power conversion efficiency (PCE)) of the tandem cell.

According to an embodiment, the transparent polymer, which forms a base matrix of the polymeric antireflective coating film, may use any polymer that is applicable to a polymeric antireflective coating film for a photoelectric device without limitation. In some examples, the transparent polymer may be a thermosetting or photocurable polymer. In some examples, the transparent polymer may include at least one or a combination of polydimethylsiloxane (PDMS), polydiphenylsiloxane (PDPhS), polymethylphenylsiloxane (PMPS), ethylene-vinyl acetate copolymer (EVA), poly olefin elastomer (POE), polymethyl metacrylate (PMMA), cellulose triacetate (TAC), polyethylene terephthalate (PET), poly(ether ketone) (PEK), polymer glass, polycarbonate (PC), polyolefin (e.g. polyethylene (PE), polypropylene (PP), etc.), cyclic olefin copolymer (COC), ethylene vinyl acetate, polyvinyl chloride (PVC), polyamide (PA), polyurethane, polymethylmethacrylate (PMMA), polyarylate, polyvinyl acetate, polyethylene phthalate, polyimide (PI), polyethylene terephthalate (PET), polyethersulfone (PES), and polybutylene terephthalate (PBT). In some examples, the transparent polymer may be selected from a group consisting of polydimethylsiloxane (PDMS), polydiphenylsiloxane (PDPhS), polymethylphenylsiloxane (PMPS), ethylene-vinyl acetate copolymer (EVA), poly olefin elastomer (POE), polymethyl metacrylate (PMMA), and cellulose triacetate (TAC), and polyethylene terephthalate (PET).

According to an embodiment, the textured surface of the polymeric antireflective coating film may be a geometric three-dimensional (3D) textured surface by a 3D structure. According to an embodiment, the 3D structure may be regularly or irregularly arranged. In some examples, the 3D structure may include at least one or a combination of a spherical, elliptical, conical, polygonal pyramid (e.g., triangular pyramid, quadrangular pyramid, pentagonal pyramid, hexagonal pyramid, etc.), polygonal prism (e.g., triangular prism, quadrangular prism, pentagonal prism, hexagonal prism, etc.), cylindrical, oval, polygonal (e.g., n-polygon, wherein n denotes an integer of 3 or greater), and a polygonal star pyramid (e.g., a pentagonal star, a hexagonal star, a heptagonal star, an octagonal star, etc.). According to an embodiment, the 3D textured surface may include a protrusion, a recess, or both. In some examples, the protrusion may be associated with the 3D structure described above. In some examples, the recess may be a groove having a form (or a cross section) of the 3D structure described above. A bottom surface of the recess may be round or pointed tip (e.g., v-shaped). In some examples, the height of the protrusion (e.g., the height of the 3D structure) and the depth of the recess may each be from about 1 micrometer (um) to about 10 um; about 2 um to about 10 um; about 3 um to about 10 um; about 5 um to about 10 um; about 2 um to about 8 um; about 2 um to about 6 um; or preferably about 2 um to about 5 um.

In some examples, the diameter (or length) of the protrusion and the diameter (or length) of the recess may each be from about 1 um to about 10 um; about 2 um to about 10 um; about 3 um to about 10 um; about 5 um to about 10 um; about 2 um to about 8 um; about 2 um to about 6 um; or preferably about 2 um to about 5 um. In some examples, when it is within the ranges described above, surface reflection may be reduced.

According to an embodiment, the phosphors and the oxide nanoparticles may be about 0% by weight (or 0 weight %) (exceeding) to about 6 weight %; about 0 weight % (exceeding) to about 5 weight %; about 0 weight % (exceeding) to about 4 weight %; about 0 weight % (exceeding) to about 3 weight %; about 0 weight % (exceeding) to about 2 weight %; about 0 weight % (exceeding) to about 1.5 weight %; about 0 weight % (exceeding) to about 1 weight %; about 0.5 weight % to about 4 weight %; or about 0.5 weight % to about 3.6 weight % of the polymeric antireflective coating film. In some examples, the phosphors may be about 0 weight % (exceeding) to about 2 weight %; about 0 weight % (exceeding) to about 1.8 weight %; about 0 weight % (exceeding) to about 1.5 weight %; about 0.1 weight % (exceeding) to about 2 weight %; about 0.3 weight % (exceeding) to about 2 weight %; or preferably about 0.4 weight % (exceeding) to about 1.6 weight % of the polymeric antireflective coating film. In some examples, the oxide nanoparticles may be about 0 weight % (exceeding) to about 4 weight %; about 0 weight % (exceeding) to about 3 weight %; about 0 weight % (exceeding) to about 2 weight %; about 0.1 weight % to about 3 weight %; about 0.1 weight % to about 2 weight %; about 0.3 weight % to about 2 weight %; or about 0.4 weight % to about 2 weight % of the polymeric antireflective coating film. In some examples, when it is included within the ranges described above, a combination of a down-conversion effect of the phosphor particles (e.g., micro-size particles) and a multi-scattering effect of the oxide nanoparticles may reduce the surface reflection and improve the stability by UV light.

According to an embodiment, the mass ratio of the phosphors to the oxide nanoparticles may be about 1:10 to about 1:1; or preferably about 1:5 to about 1:1. In some examples, when it is included within the ranges described above, a combination of a down-conversion effect of the phosphor particles and a multi-scattering effect of the oxide nanoparticles may reduce the surface reflection and improve the stability by UV light.

According to an embodiment, applying the phosphors to the polymeric antireflective coating film may set an optical design for reducing the surface reflection through the textured antireflective layer and converting UV light that potentially degrades the quality into visible light that is useful.

According to an embodiment, the polymeric antireflective coating film may use the micro-size phosphors (e.g., phosphor particles) that absorb a UV region and fluoresce in a visible region to overcome UV photostability and may, as a result, improve an optical path and improve the photostability. That is, adding the phosphors to solve the parasitic absorption of UV light may convert UV light into visible light.

According to an embodiment, the polymeric antireflective coating film may realize red, green, and blue (RGB) implementation by adjusting a fluorescence region of the phosphors used for the antireflective coating film without additional technology for aesthetics. In some examples, the polymeric antireflective coating film may be used in various fields including, for example, power generation facilities (e.g., building-integrated photovoltaic (BIPV) systems and vehicle-integrated photovoltaic (VIPV) systems) in addition to photoelectric devices, using such aesthetics.

According to an embodiment, the size of the phosphors may be about 1 um to about 5 um. In this case, the size of the phosphors may correspond to a particle diameter measured by a dynamic light scattering (DLS) method that calculates the size using the Stokes-Einstein equation.

According to an embodiment, the phosphors may include at least one or a combination of a green phosphor, a red phosphor, a blue phosphor, a yellow-red phosphor, and a green-yellow phosphor. According to an embodiment, the phosphors may include at least one of or a combination of two or more of a garnet-type phosphor, a silicate-based phosphor, a sialon-based phosphor, a sulfide-based phosphor, a silicon oxynitride-based phosphor, an oxynitride-based phosphor, an oxide-based phosphor, a nitride (e.g., silicon nitride)-based phosphor, and an aluminate-based phosphor.

According to an embodiment, the phosphors may be a powder-type phosphor that emits fluorescence (fluorescence of a longer wavelength than that of excitation light) by irradiation of excitation light (e.g., UV light region). In some examples, as the phosphors, a phosphor that converts a UV light region into a visible light region may be used.

In some examples, the phosphors may be selected from a group consisting of a green phosphor having an emission peak or central wavelength in a wavelength region of about 510 nm to about 560 nm or about 520 nm to about 560 nm; a red phosphor having an emission peak or central wavelength in a wavelength region of about 600 nm to about 660 nm or about 590 nm to about 650 nm; and a blue phosphor having an emission peak or central wavelength in a wavelength range of about 450 nm to about 480 nm or about 460 to about 470 nm, with light in a wavelength range of about 350 nm to about 480 nm being used as an excitation source.

In some examples, the sulfide-based phosphor may be selected from a group consisting of CaS:Eu (red), SrS:Eu (red), (Sr,Ca)S:Eu (red), $SrGa_2S_4$:Eu (green), $SrGa_2S_4$:Eu, $BaGa_2S_4$:Eu, $SrAl_2S_4$:Eu(Ca,Sr,Ba)(Al,Ga,In)$_2S_4$:Eu (or, Ce), (Ca,Sr)S:$Eu^{2+}$ (red), (Sr,Ca)$Ga_2S_4$:$Eu^{2+}$(green), $SrSi_2O_2N_2$:$Eu^{2+}$ (green), or the like, but is not limited thereto.

In some examples, the silicate-based phosphor may be selected from a group consisting of $Ba_2SiO_4$:Eu, $Ca_2SiO_4$:Eu, $Sr_2SiO_4$:Eu, $Ba_2SrSiO_4$:Eu, (Ba,Ca,Eu,Sr)$_2SiO_4$, (BaSr)$_3SiO_5$:Eu, (BaSr)$_2SiO_4$:Eu, $Ca_8Mg(SiO_4)_4Cl_2$:Eu, $Ca_2Sr_2MgSi_2O_7$:Eu, $Ca_3Sc_2Si_3O_{12}$:Ce, (Sr,Ba,Ca,Mg,Zn)$_2$Si(OD)$_4$:$Eu^{2+}$(D=F, Cl, S, N, or Br) (greenish yellow), $Ba_2MgSi_2O_7$:$Eu^{2+}$, $Ba_2SiO_4$:$Eu^{2+}$ (green), $Ca_3$(Sc,Mg)$_2Si_3O_{12}$:$Ce^{3+}$ (green), or the like, but is not limited thereto.

In some examples, the nitride-based (or silicon nitride-based) phosphor may be selected from a group consisting of $BaSi_2O_2N_2$:Eu, $SrSi_2O_2N_2$:Eu, $CaSi_2O_2N_2$:Eu, $Ba_3Si_6O_{12}N_2$:Eu, $CaAlSiN_3$:$Eu^{2+}$ (red), (Sr,Ca)$AlSiN_3$:$Eu^{2+}$ (yellow red), $Sr_2Si_5N_8$:$Eu^{2+}$ (red), or the like, but is not limited thereto.

In some examples, the sialon-based phosphor may be selected from a group consisting of β-SiAlON:Re, β-SiAlON:Eu, or the like, but is not limited thereto.

In some examples, the oxide-based phosphor may be selected from a group consisting of $Sr_4Al_{14}O_{25}$:Eu, $CaSc_2O_4$:Ce, $SrAl_2O_4$:Eu, SiAlON:$Ce^{3+}$ (bluish green), β-SiAlON:$Eu^{2+}$ (greenish yellow), Ca-α-SiAlON:$Eu^{2+}$ (orange), $Ba_3Si_6O_{12}N_2$:$Eu^{2+}$ (green), or the like, but is not limited thereto. In some examples, the aluminate-based phosphor may be selected from a group consisting of (Y,Gd)$_3$(Al, Ga)$_5O_{12}$:Ce (blue), (Sr,Ba)$Al_2O_4$:$Eu^{2+}$ (blue), (Mg,Sr)$Al_2O_4$:$Eu^{2+}$ (blue), $BaMg_2Al_{16}O_{27}$:$Eu^{2+}$ (blue), or the like, but is not limited thereto.

According to an embodiment, the polymeric antireflective coating film may simulate an optical operation design using a Mie scattering effect to overcome an optical loss due to backward scattering by a micro-size phosphor to set oxide nanopowder and may introduce the set nanopowder to the polymeric antireflective coating film together with the phosphor. This may contribute to improving the optical performance and efficiency of photoelectric devices. In some examples, the oxide nanopowder (e.g., $SiO_2$ nanoparticles) of the polymeric antireflective coating film may increase a diffuse transmittance to decrease a reflectance. In some examples, the embedded phosphors may increase the reflectance of an ARC film by the large particle size (e.g., >about 5 μm) and the high refractive index (e.g., n≈1.9) of the phosphors, and may add the oxide nanopowder (e.g., spherical $SiO_2$ nanoparticles) to supplement a backward scattering problem of the phosphors. In some examples, the optical properties of the textured polymeric antireflective coating (ARC) film may be improved by a combination of a down-conversion effect of the large phosphor particles and a multi-scattering effect of the oxide nanopowder (e.g., $SiO_2$ nanoparticles).

According to an embodiment, the oxide nanoparticles may have a size of about 30 nm to about 400 nm; about 30 nm to about 340 nm; about 30 nm to about 300 nm; about 30 nm to about 250 nm; about 30 nm to about 200 nm; about 40 nm to about 150 nm; about 50 nm to about 100 nm; or preferably about 30 nm to about 100 nm. In some examples, the size may be length, diameter, thickness, or the like depending on the shape of the particles. In some examples, the oxide nanoparticles may be spherical, polyhedral, beaded, elliptical, or the like. In some examples, the ranges of the size described above may be used to prevent the degradation of optical properties and stability required by backward scattering of the phosphors in the antireflective coating film. In addition, the ranges of the size described above may be used to prevent an increase in reflectance or a decrease in light transmittance by an increase in the size of the oxide nanoparticles.

According to an embodiment, the oxide nanoparticles may include oxide particles having a light-scattering function, and the oxide nanoparticles may include light scattering particles including at least one of silica, antimony oxide, boron oxide, calcium oxide, titanium oxide, magnesium oxide, barium oxide, aluminum oxide, bismuth oxide, zirconium oxide, tin oxide, tungsten oxide, strontium oxide, niobium oxide, and zinc oxide, or a combination thereof. In some examples, the oxide nanoparticles may be mixed with organic beads such as styrene and acrylic to be used.

According to an embodiment, the thickness of the polymeric antireflective coating film may be about 50 um to about 300 um; or preferably about 100 um to about 200 um. According to an embodiment, the light transmittance of the polymeric antireflective coating film may be about 90% or more; about 95% or more; or about 90% to about 97%.

A method of manufacturing a polymeric antireflective coating film according to embodiments of the present disclosure may include: preparing a base resin composition including a polymer resin and a curing agent; injecting a phosphor dispersion into the base resin composition and mixing them; removing a solvent of the dispersion from a mixture of the phosphor dispersion and the base resin composition; injecting and mixing oxide particles; and curing after coating on a substrate.

According to an embodiment, the polymer resin, the phosphor, and the oxide may be the same as the ones described above regarding the polymeric antireflective coating film. According to an embodiment, the curing agent may be appropriately selected according to a type of polymer or a curing method and may use any curing agent that is applied to a curing process for forming a film without limitation. The curing agent may be, for example, Sylgard 170, Sylgard 184, or Sylgard 186, but is not limited thereto. For example, the curing agent may be included, with respect to the polymer resin, with about 0.01 weight % to about 2 weight %; about 0.01 weight % to about 1.5 weight %; about 0.01 weight % to about 1 weight %; or about 0.1 weight % to about 1 weight %.

According to an embodiment, the phosphor dispersion may include a phosphor and solvent of about 0.1 weight % to about 2 weight %; or more preferably about 0.4 weight % to about 1.6 weight %, and the solvent may use any solvent that enables dispersion of the phosphor, for example, methanol, ethanol, or the like, without limitation.

According to an embodiment, the step of removing the solvent may remove the solvent applied to the phosphor dispersion under a vacuum. In some examples, the solvent may have a boiling point of about 100° C. or less; about 90° C. or less; about 80° C. or less; about 70° C. or less; or about 50° C. or less and may be preferably ethanol. In some examples, the solvent may be removed at a temperature of room temperature to about 100° C.; room temperature to about 90° C.; room temperature to about 80° C.; or about 30° C. to about 50° C.

According to an embodiment, for the coating, a known coating method may be applied without limitation, and the coating method may include, as non-limiting examples, spin coating, spray coating, bar coating, print coating, or the like.

According to embodiments of the present disclosure, a photoelectric device including a polymeric antireflective coating film according to embodiments of the present disclosure may be provided. According to an embodiment, the photoelectric device may include a perovskite solar cell, a silicon solar cell, or both. In some examples, the photoelectric device may include a monolithic perovskite solar cell layer; and a silicon tandem solar cell layer. In some examples, in the photoelectric device, the polymeric antireflective coating film may be disposed on the monolithic perovskite solar cell layer.

According to an embodiment, the perovskite solar cell may include a configuration known in the art to which the present disclosure pertains, and thus may not be further described herein. For example, the perovskite solar cell may include a first electrode and a second electrode, and a perovskite light absorption layer between the first electrode and the second electrode. According to an embodiment, the perovskite solar cell may further include a functional layer such as a hole transport layer, a perovskite passivation layer, an electron transport layer, a buffer layer, or the like.

According to an embodiment, the perovskite may be inorganic metal halide perovskite, organic-inorganic hybrid perovskite, or the like. For example, the perovskite may be of a structure represented by a chemical formula such as $ABX_3$, $A_2BX_4$, $ABX_4$, $APbX_3$. $A_{n-1}Pb_nI_{3n+1}$ (where n is an integer between 2 and 6). In some examples, the perovskite may be a mixture of one type, two types, or three or more types. In some examples, in the foregoing chemical formula, A may be an alkali metal, an organic cation (e.g., organoammonium), and/or an inorganic cation, B may be a metal, and X may be selected from among a halide anion, a chalcogenide anion, and SCN-(thiocyanate). For example, A may be an alkali metal of Na, K, Rb, Cs, or Fr; $(CH_3NH_3)_n$, $((C_xH_{2x+1})_nNH_3)_2(CH_3NH_3)_n$, $(RNH_3)_2$, $(C_nH_{2n+1}NH_3)_2$, $(CF_3NH_3)$, $(CF_3NH_3)_n$, $((C_xF_{2x+1})_nNH_3)_2(CF_3NH_3)_n$, $((C_xF_{2x+1})_nNH_3)_2$, or $(C_nF_{2n+1}NH_3)_2$ (where n is an integer greater than or equal to 1, and x is an integer greater than or equal to 1), and B may be a divalent transition metal, a rare earth metal, an alkaline earth metal, Pb, Sn, Ge, Ga, In, Al, Sb, Bi, Po, or the like (e.g., selected from a group consisting of Be, Mg, Ca, Sr, Ba, Fe, Cd, Co, Ni, Cu, Ag, Au, Hg, Sn, Ge, Ga, Pb, In, TI, Sb, Bi, Ti, Zn, Cd, Hg, Mn, Ge, Eu, Zr, or the like). X may be P, Cl, Br, I, or the like. In some examples, the perovskite may be $CH_3NH_3PbI_3$, $CH_3NH_3PbBr_3$, $CH_3NH_3PbI_2Cl$, $CH_3NH_3PbI_2Br$, or the like. In some examples, when two or more types of perovskite compounds are included, a ratio of the first perovskite compound to the second perovskite compound may be 5:5 to 9:1. In some examples, it may further include a chemical compound represented by a chemical formula such as NaX', ZnX', KX', and CsX' (where X is selected from Cl, Br, and I), which may be included with about 10% or less or about 5% or less of the total perovskite compounds.

According to an embodiment, the silicon solar cell may include a configuration known in the art to which the present disclosure pertains, and may include a structure in which, for example, a glass substrate, a silicon wafer, a transparent electrode layer, a p-type amorphous silicon layer, an i-type amorphous silicon layer, an n-type amorphous silicon layer, a hole transport layer, an organic photoactive layer, and a metal electrode layer are sequentially stacked. The silicon solar cell may further include another known configuration as needed.

According to an embodiment, the hole transport layer or the electron transport layer may include titanium (Ti) oxide, zirconium (Zr) oxide, strontium (Sr) oxide, zinc (Zn) oxide, indium (In) oxide, lanthanum (La) oxide, vanadium (V) oxide, molybdenum (Mo) oxide, tungsten (W) oxide, tin (Sn) oxide, niobium (Nb) oxide, magnesium (Mg) oxide, aluminum (Al) oxide, yttrium (Y) oxide, scandium (Sc) oxide, samarium (Sm) oxide, gallium (Ga) oxide, strontium-titanium (Sr—Ti) oxide, lithium fluoride (LiF), poly(3,4-ethylenedioxythiophene):poly(styrenesulfonate), PEDOT: PSS), polyaniline, polypyrrole, P3HT(poly[3- hexylthiophene]), Spiro-OMeTAD (2,2',7,7'-tetrakis(N,N-di-p-methoxyphenylamine) 9,9'-spirobifluorene), PTB7 (Poly[4,8-bis[(2-ethylhexyl)oxy]benzo[1,2-b: 4,5-b']dithiophene-2,6-diyl][3-fluoro-2-[(2-ethylhexyl) carbonyl]thieno [3,4-b]thiophenediyl]]), MDMO-PPV (poly[2-methoxy-5-(3',7'-dimethyloctyloxyl)]-1,4-phenylenevinylene), MEH-PPV(poly[2-methoxy-5-(2"-ethylhexyloxy)-p-phenylene vinylene]), P3OT (poly(3-octyl thiophene)), POT (poly(octyl thiophene)), P3DT (poly(3-decyl thiophene)), P3DDT (poly(3-dodecyl thiophene), PPV(poly(p-phenylene vinylene)), TFB(poly(9,9'-dioctylfluorene-co-N-(4-butylphenyl)diphenyl amine), polyaniline, F8BT(poly(9,9'-dioctylfluorene-cobenzothiadiazole), PEDOT(poly(3,4-ethylenedioxythiophene)), PTAA(poly(triarylamine)), poly-TPD(Poly(4-butylphenyldiphenyl-amine), a copolymer thereof, or at least one of combinations thereof, but is not limited thereto.

According to an embodiment, the first electrode may include at least one of ITO, IZO, FTO, or AZO, and the second electrode may include at least one metal selected from a group consisting of Ag, Au, and Al, or a metal electrode, but is not limited thereto.

Hereinafter, the present disclosure will be described in detail based on examples and comparative examples.

However, the following examples are provided only to illustrate the embodiments of the present disclosure and are not used to limit the present disclosure.

EXAMPLES

Fabrication of Textured Si Mold:

A Si substrate was cut (e.g., into square pieces of 30 mm×30 mm) and then cleaned using ultrasonic waves in acetone, deionized water, and ethanol for 10 minutes each. Before wet etching, the Si substrate was immersed in a buffered oxide etchant (BOE) to remove a native oxide film from the surface of the Si substrate. Subsequently, the Si samples were rinsed with DI water and then dried using an $N_2$ gas flow. To fabricate a micro-pyramidal Si mold, the Si substrate was immersed in a potassium hydroxide solution at 95° C. for 10 minutes and was then immersed in a mixed solution of KOH, IPA, and DI water (8:5:100 v/v) at 70° C. for 40 minutes to be chemically wet etched. The samples were rinsed with deionized water and dried with $N_2$ gas.

30 nm $SiO_2$ NP was purchased from the United States of America (USA) (Research Nanomaterials, Inc.). 100 nm, 340 nm, and 1300 nm $SiO_2$ NPs were synthesized by the Stöber method. A homogeneous solution was prepared by mixing $NH_4OH$ (3 mL for 100 nm and 4.5 mL for 340 nm) and ethanol (50 mL) overnight at room temperature with magnetic stirring (ca. 500 rpm). TEOS (Tetraethyl orthosilicate, 1.5 mL) was added dropwise to the solution while stirring.

The solution was continuously stirred for 12 hours to form a clear silica sol. Silica particles were collected by centrifugation at 8000 rpm for 20 minutes and then redispersed in ethanol three times. For 1300 nm, a seed solution (500 nm $SiO_2$) was prepared by slowly adding TEOS (3.9 mL) to a solution of $NH_4OH$ (10.75 mL) and ethanol (50 mL). The seed solution was then mixed with $NH_4OH$ (11.8 mL), ethanol (50 mL), and TEOS (4.2 mL) to form 1300 nm $SiO_2$ NPs. The solution was kept at room temperature for 24 hours with magnetic stirring (500 rpm).

Fabrication of Antireflective Coating Film:

Silicate-based green phosphors (SGA 550 100 isiphor) were purchased from "Merck KgaA, Darmstadt, Germany." To prevent aggregation of the phosphors, the powder was first dispersed in ethanol (ethanol:powder ratio=15:1 to 30:1) using sonication and was then added into a PDMS solution with the volume percentages of 0.0%, 0.4%, 0.8%, 1.2%, and 1.6%. The PDMS solution was prepared using a mixture (Sylgard 184, Dow Corning Co.) of a base resin and a curing agent (10:1% by weight). After the complete removal of ethanol by vacuum for 2 hours, $SiO_2$ particles were added to the solution and mixed carefully. The PDMS solution in which the phosphors and the $SiO_2$ particles were mixed was poured into the textured Si mold and cured at 65° C. overnight. The film was transferred onto the top surface of a perovskite/Si tandem solar cell.

Fabrication of Si Solar Cell:

A Si wafer (monocrystalline Si wafers (1-5 Ωcm, p-type, CZ, 525 μm)) was cleaned using an RCA cleaning procedure. 2 micron-thick aluminum was deposited on the back side of the Si wafer using an electron beam evaporator. A spin-on dopant (Filmtronics SOD P507) was coated on the front side of the Si wafer using spin coating. A doping level was controlled and optimized using a rapid thermal annealing (RTA) system. An emitter having a sheet resistance of 100 ohms $sq^{-q}$ was formed on the front side, and a P+Al BSF (Al-back-surface-field) was formed on the back side. The remaining phosphorous silicate glass was oxidized using the RTA system and removed with hydrofluoric acid. Alternatively, a 1 um Ag metal electrode was deposited on the back side using a beam (e.g., e-beam evaporator). Lastly, a recombination layer was formed by depositing a 20 nm-thick ITO through an RF magnetron sputtering process.

Fabrication of Perovskite Solar Cell and Tandem Solar Cell:

A PTAA solution (2 mg $mL^{-L}$ in chlorobenzene) was spin-coated onto the substrate at 6000 rpm for 30 seconds and annealed at 100° C. for 10 minutes. A solution of 0.5 mg $mL^{-1}$ PFN-Br in methanol was spin-coated on PTAA HEL at 5000 rpm for 30 seconds. To prepare a $Cs_{0.05}(FA_{0.83}MA_{0.17})_{0.95}Pb(I_{0.75}Br_{0.25})_3$ mixed perovskite solution, 1.35 m $FAPbI_3$ with 10% excess $PbI_2$ and 1.35 m $MAPbBr_3$ in a N,N-dimethylformamide (DMF)/dimethyl sulfoxide (DMSO)(4:1 v/v) cosolvent; and 1.5 m CsI stock solution in DMSO were prepared separately. Subsequently, the $FAPbI_3$, $MAPbBr_3$, and CsI solutions were mixed at a volume ratio of 750:250:53.7. The mixed perovskite solution was cast by anti-solvent dropping method. The spin-coating may include spinning at 5000 rpm for 1.7 seconds for a ramping time and then spinning at 5000 rpm for 30 seconds in a hold phase. After 10 seconds, the spinning substrate was cleaned with 300 μL ethyl acetate as an anti-solvent.

Subsequently, the perovskite film was annealed at 100° C. for 1 hour. The PCBM (OSM) solution (20 mg $mL^{-L}$ in chlorobenzene) was spin-coated at 4000 rpm for 30 seconds, and a ZnO solution (Avantama) was heat-treated at 100° C. for 1 minute after coating under the same conditions. Subsequently, an Ag electrode having a thickness of 100 nm was deposited using an e-beam evaporator. A monolithic perovskite/Si tandem solar cell was fabricated by applying a translucent perovskite solar cell process on top of a tandem-oriented bottom Si solar cell.

Characterization Method:

A device area defined by a shadow mask is 0.25 $cm^2$. The J-V characteristics of the perovskite/Si tandem solar cell were measured under the condition of AM 1.5G (100 $mWcm^{-2}$) with illumination with an aperture mask (0.25 $cm^2$). IPCE spectra were measured using a QE measurement system (Newport) under an ambient condition with the application of monochromatic illumination from a Xenon lamp. A total transmittance and a diffuse transmittance were measured using a UV-vis-NIR spectrophotometer with a 100 nm-diameter integrating sphere (LAMBDA 750, Perkin Elmer). Photoluminescence (PL) measurements were performed using a spectrofluorometer (QuantaMaster, PTI). Excitation and emission spectra were recorded in 1 nm increments from 280 nm to 480 nm and 400 nm to 680 nm, respectively.

Figure 1B:
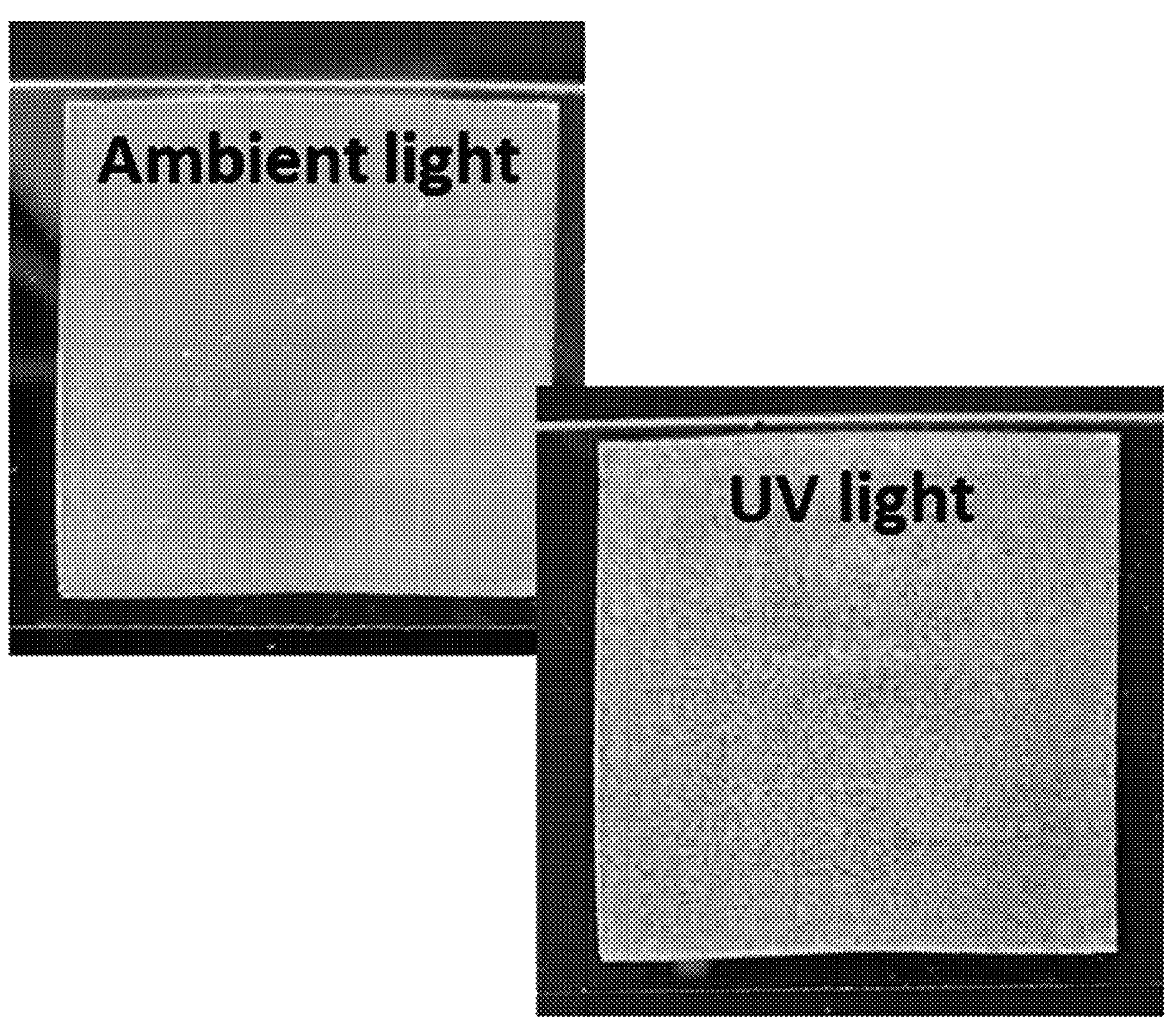
FIG. 1B is an image showing a polymeric antireflective coating film (e.g., a PDMS layer) including a phosphor (e.g., SGA phosphor) and oxide nanoparticles (e.g., $SiO_2$ nanoparticles) under ambient light and ultraviolet (UV) light ($\lambda$=365 nm).
Figure 1C:
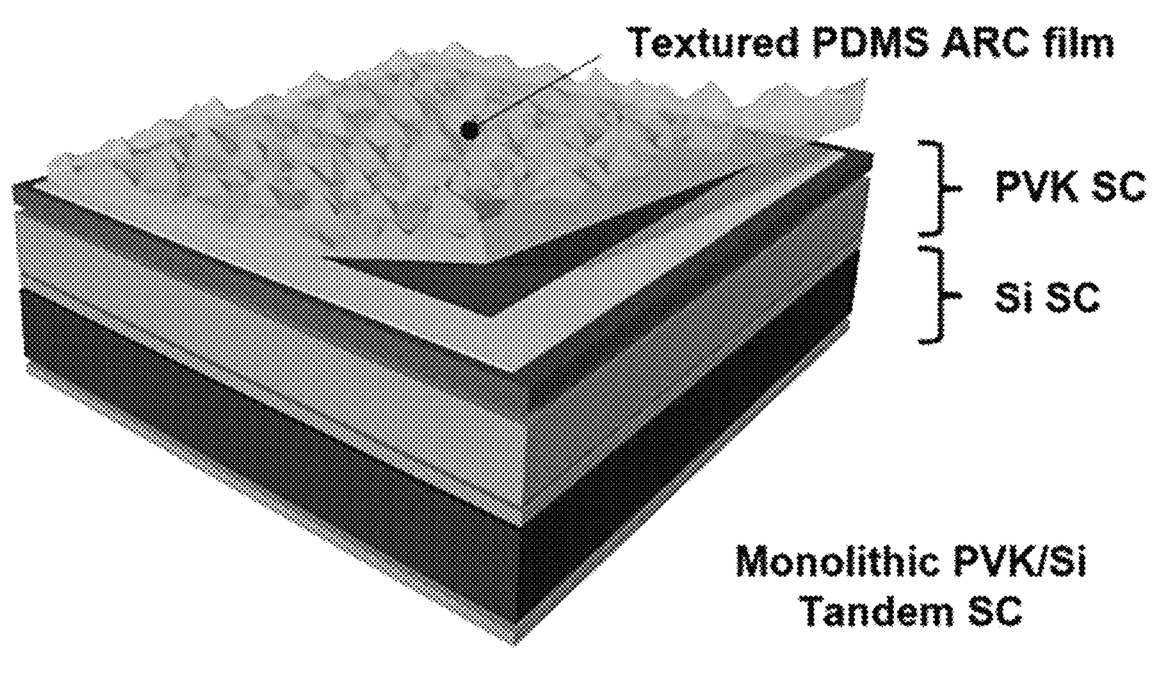
FIG. 1C is a schematic diagram showing a perovskite/silicon (Si) tandem solar cell with a PDMS layer including an SGA phosphor and $SiO_2$ nanoparticles.
Figure 1D:
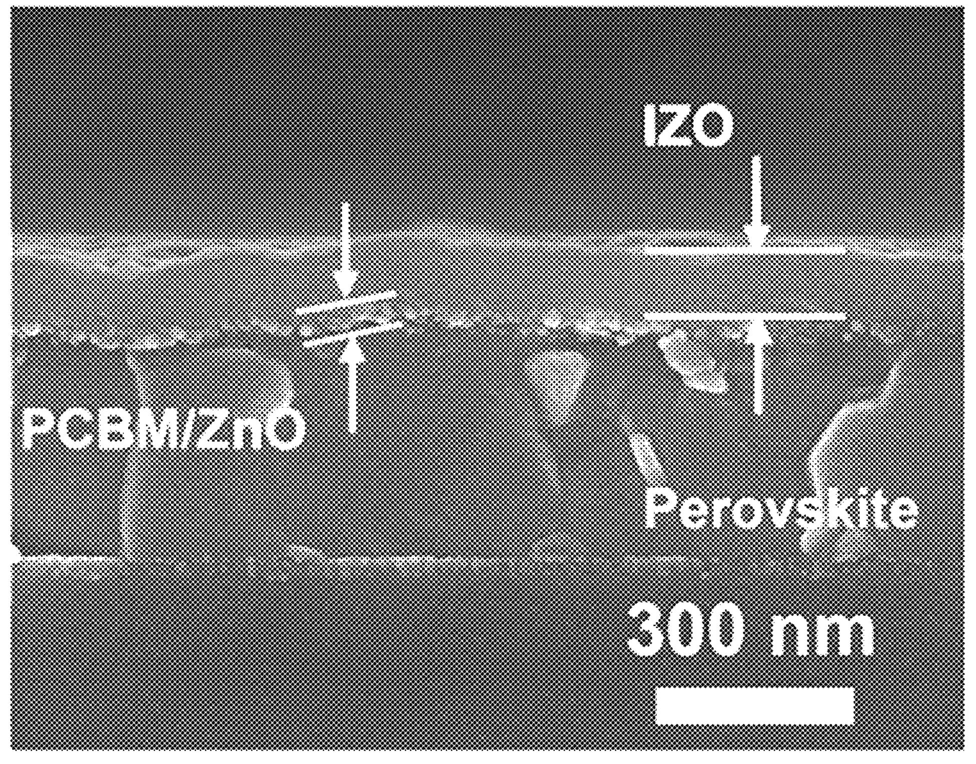
FIG. 1D is a cross-sectional scanning electron microscope (SEM) image of a perovskite/Si solar cell.

FIG. 1A is a schematic diagram showing a polydimethylsiloxane-based antireflective coating film (or a PDMS-based ARC film) including SGA phosphors and $SiO_2$ nanoparticles. FIG. 1B is an image of a PDMS-based ARC film including SGA phosphors and $SiO_2$ nanoparticles under ambient light and UV light (λ=365 nm). FIG. 1C is a schematic diagram showing a perovskite/Si tandem solar cell with a PDMS-based antireflective layer including SGA phosphors and $SiO_2$ nanoparticles. FIG. 1D is a cross-sectional scanning electron microscope (SEM) image of a perovskite/Si solar cell.

A device including a monolithic perovskite/Si tandem solar cell in which SGA phosphors and $SiO_2$ nanoparticles are embedded in a textured PDMS film used as an ARC film may control the reflectance of visible light and the parasitic absorption of UV light.

A commercially available SGA phosphor is selected as a luminophore to provide the ARC film with a UV down-conversion function, and schematic diagrams of the ARC film embedded with the SGA phosphors and the $SiO_2$ nanoparticles and the tandem solar cell with the ARC film are shown in FIGS. 1A and 1C. The textured PDMS film is designed to have a micro pyramid texture shape having a width and a height of 3-5 μm. The large SGA phosphors and the small $SiO_2$ nanoparticles were mixed on the PDMS film attached to an indium zinc oxide (IZO) film. FIG. 1B is an image of the ARC film under ambient light and UV light (λ=365 nm), and it may be verified with strong yellow-green light under UV light that the phosphors are uniformly distributed.

FIG. 1D is a cross-sectional SEM image of the perovskite/Si tandem solar cell, which shows a stacked structure of the perovskite solar cell (poly[bis(4-phenyl) (2,4,6-trimethylphenyl)amine] (PTAA)/mixed perovskite/[6,6]-Phenyl-C61-bu-tyric acid methyl ester (PC61BM)/ZnO/indium zinc oxide (IZO)) on the top.

Figure 6A:
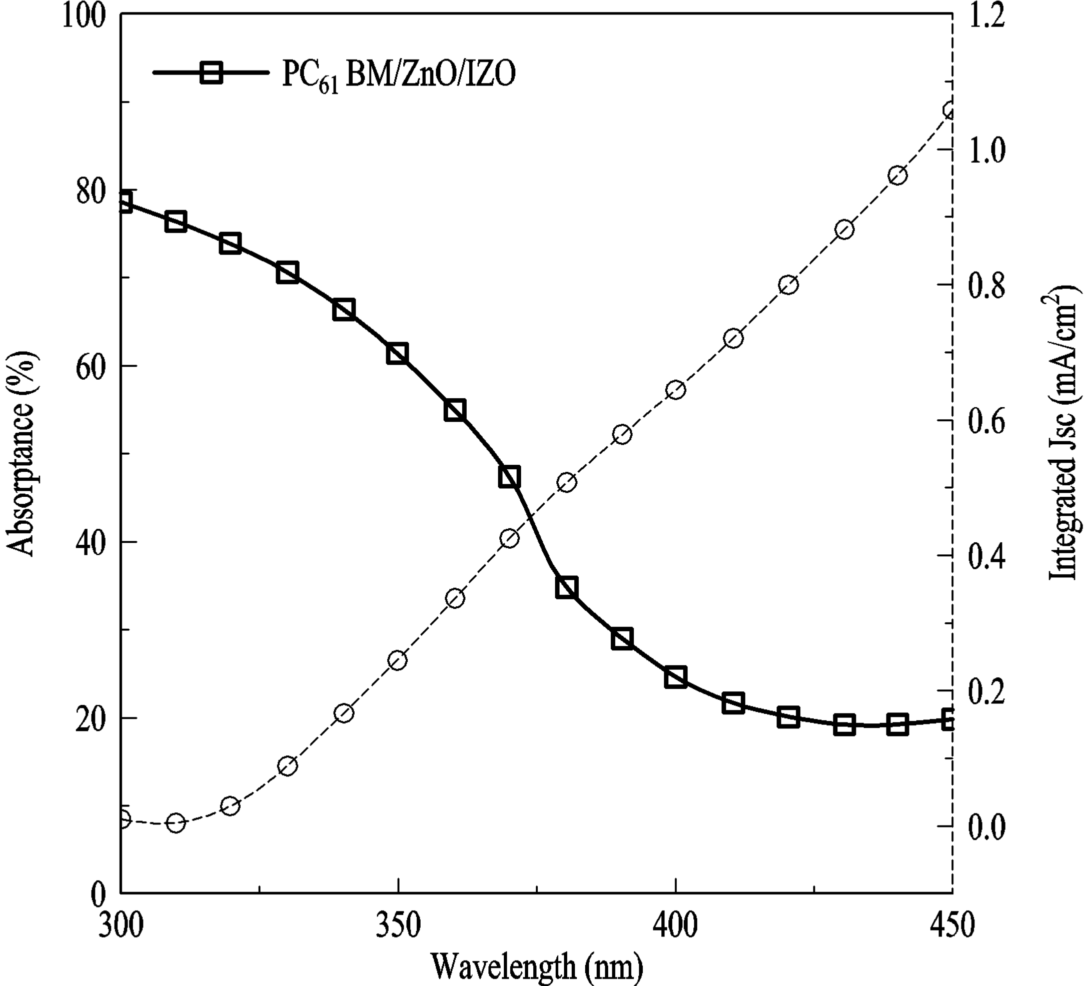
FIG. 6A is a diagram showing absorptance and integrated current density of PC61BM/ZnO/IZO within a wavelength range of 300 nm to 450 nm.

In the top cell, the PC61BM/ZnO layer is used as an electron selective layer and the 100 nm-thick IZO layer is a transparent conductive electrode for top illumination. The mixed halide perovskite layer (Cs0.05FA0.75MA0.20) Pb (I0.75Br0.25) 3 absorbs most of the visible light. A bottom cell is a p-type Si solar cell with an aluminum back-surface field (BSF) layer that converts near-infrared (NIR) light into electricity. For optimal current matching between the top cell and the bottom cell, the thickness of the perovskite layer is controlled to 340 nm. Referring to FIG. 6A, the PC61BM/ZnO/IZO layer (i.e., ETL) provides transparency to the top illumination, but has a current density (mA $cm^{-2}$) loss of 1.08 due to the parasitic absorption of the UV region. The device structure according to the present disclosure is designed to minimize a UV light loss due to the parasitic absorption of PC61BM/ZnO/IZO and maximize a diffuse transmittance. That is, the device structure according to the present disclosure may allow the ACR film to provide increased efficiency of a photoelectric device with the introduction of a micro phosphor (or mixed with $SiO_2$ nanoparticles).

Figure 2A:
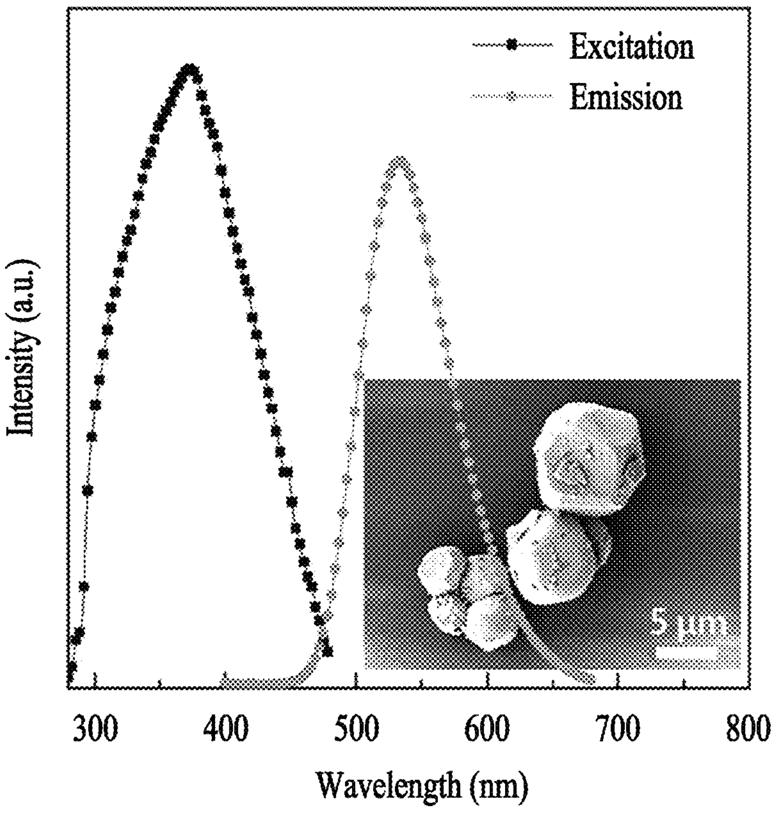
FIG. 2A is a diagram (inserted: an SEM image of an SGA phosphor) showing excitation ($\lambda_{ex}$: 380 nanometers (nm)) and emission ($\lambda_{em}$: 530 nm) of an SGA phosphor.
Figure 2B:
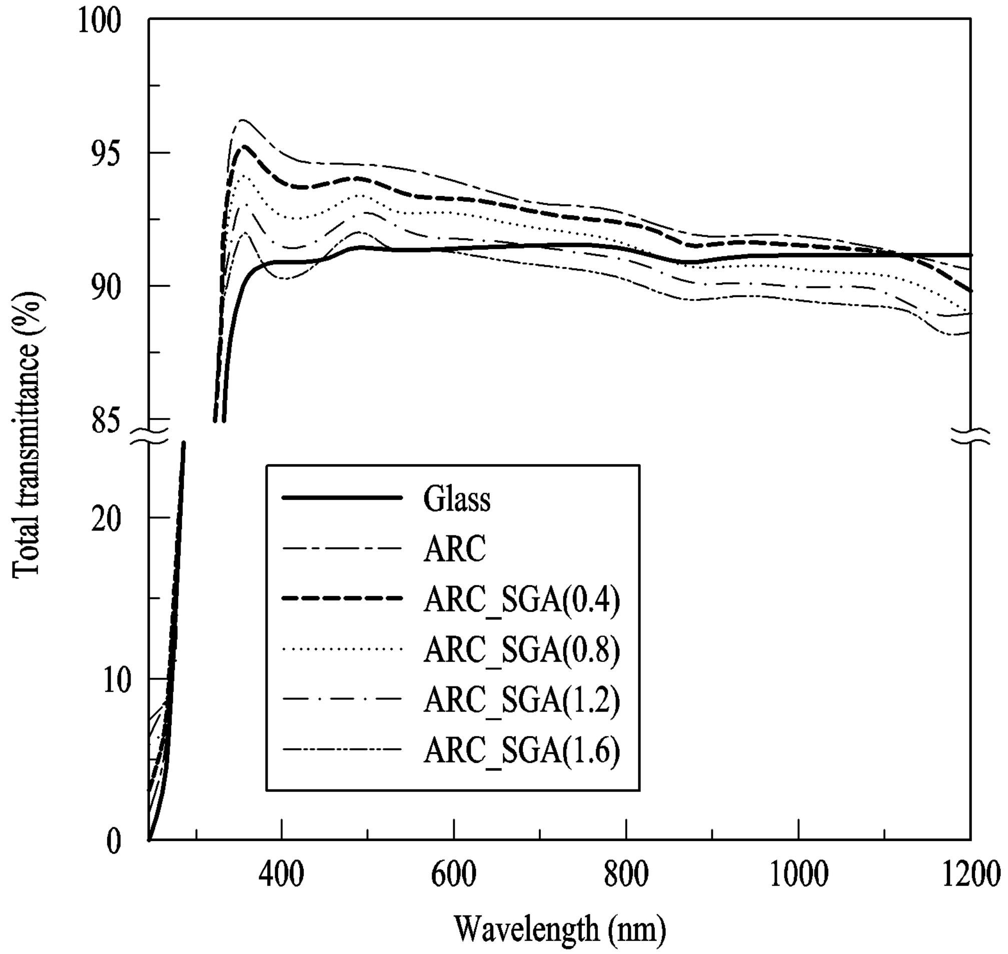
FIG. 2B is a diagram showing a total transmittance.
Figure 2C:
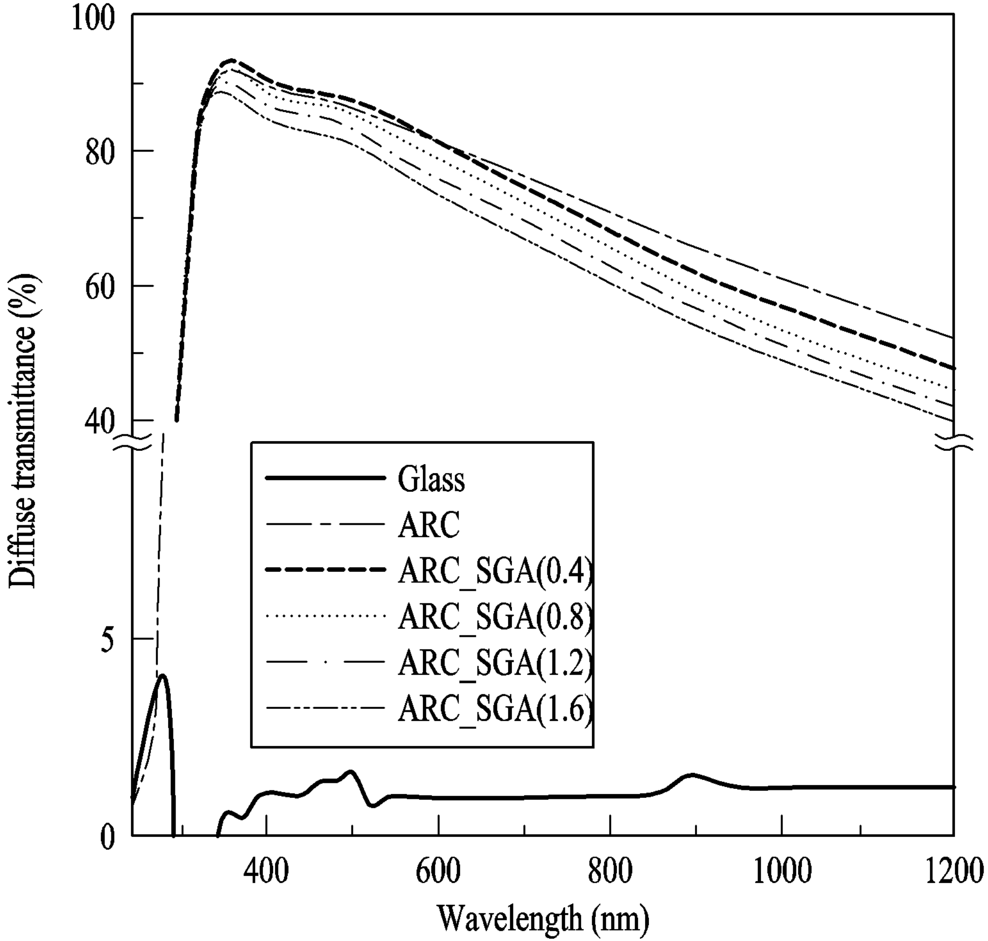
FIG. 2C is a diagram showing a diffuse transmittance.
Figure 2D:
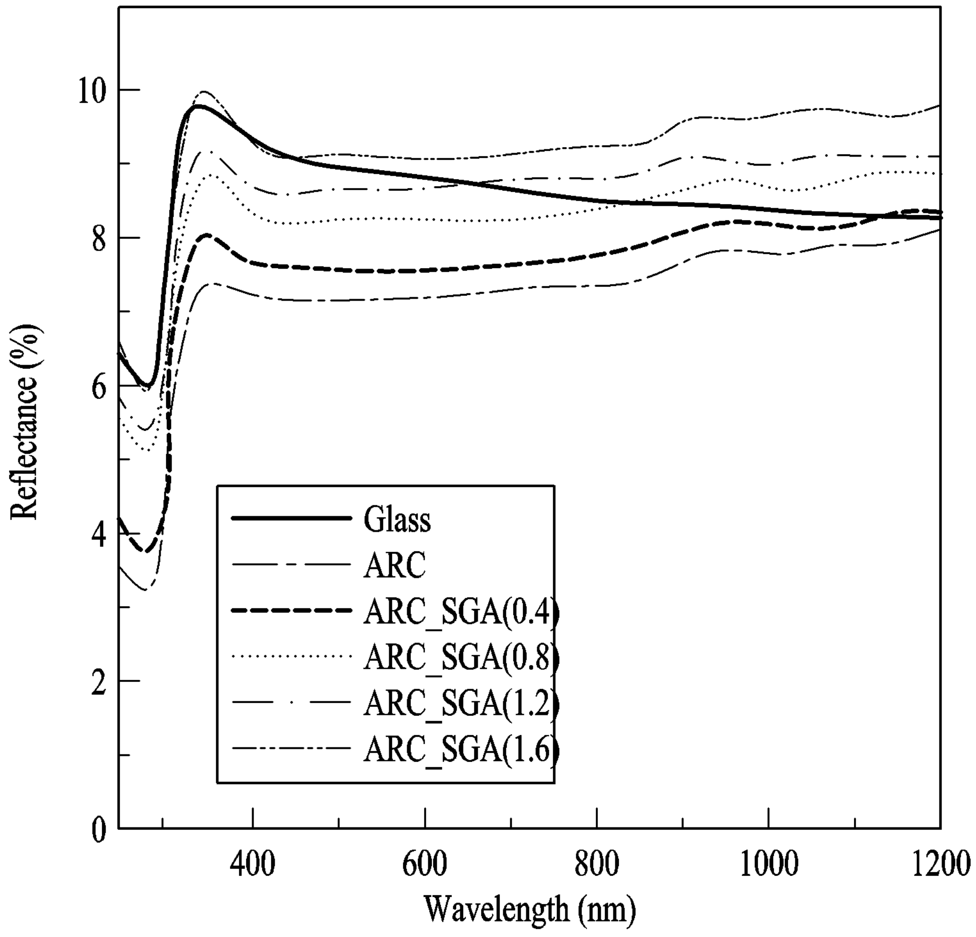
FIG. 2D is a diagram showing a reflectance of an ARC film on glass as a function of volume percentage (volume % or vol. %) of an SGA phosphor.
Figure 2E:
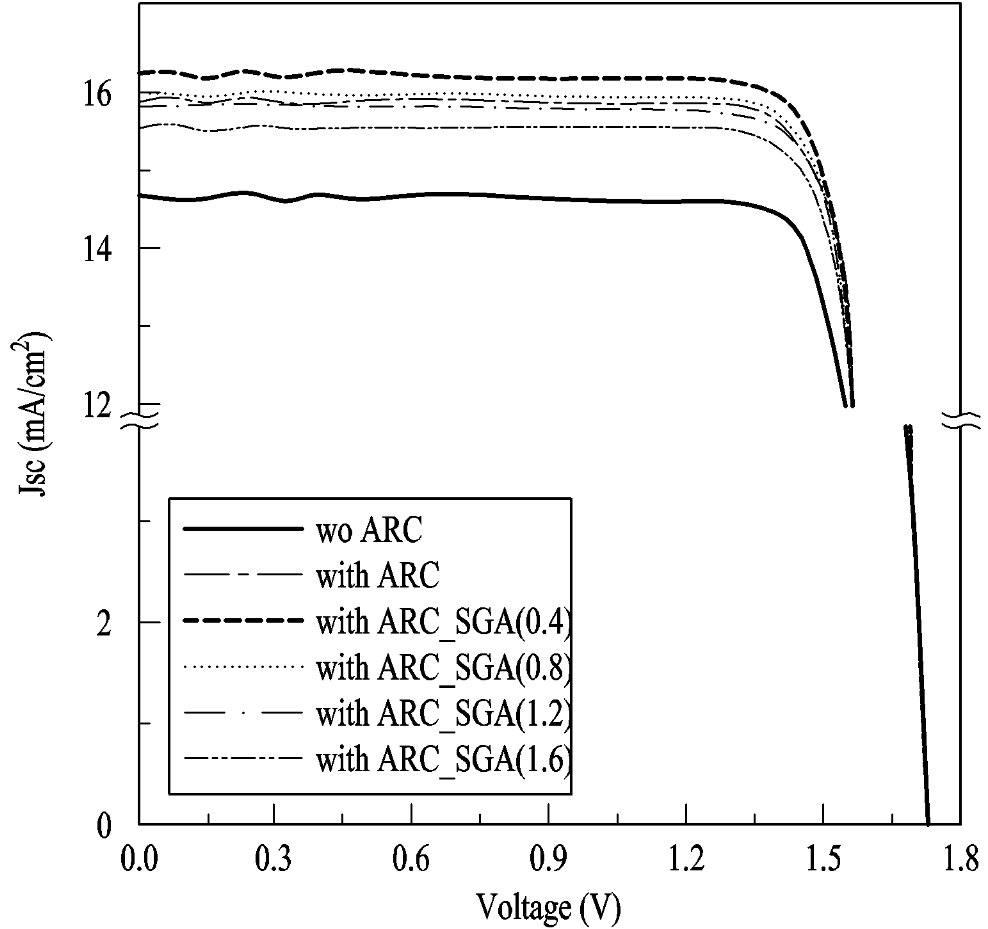
FIG. 2E is a diagram showing J-V of a tandem solar cell using the same film.
Figure 2F:
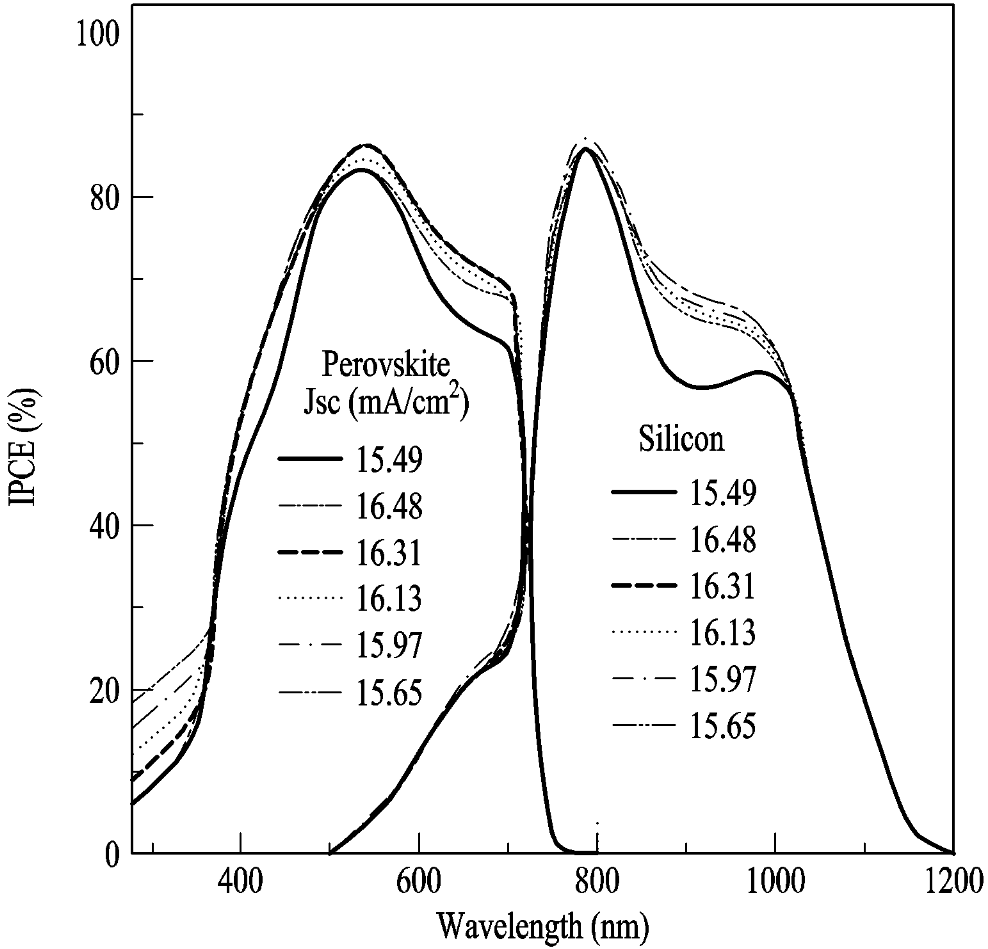
FIG. 2F is a diagram showing an incident photon-to-current efficiency (IPCE) curve.

FIG. 2A is a diagram (inserted: an SEM image of an SGA phosphor) showing excitation ($\lambda_{ex}$: 380 nm) and emission ($\lambda_{em}$: 530 nm) of the SGA phosphor, FIG. 2B is a diagram showing a total transmittance, FIG. 2C is a diagram showing a diffuse transmittance, and FIG. 2D is a diagram showing a reflectance of an ARC film on glass as a function of volume percentage (or volume %) of the SGA phosphor. FIG. 2E is a diagram showing a J-V curve of a tandem solar cell using the same film, and FIG. 2F is a diagram showing an incident photon-to-current efficiency (IPCE) curve.

FIG. 2A shows PL excitation (black curve) and PL emission (red curve) spectra of the SGA phosphor. The SEM image of the SGA phosphor shown in FIG. 2A shows that a particle size is 3-8 μm. The SGA phosphor absorbs light in a range of 280 nm to 470 nm, and peak absorption is shown at 380 nm which overlaps a parasitic light absorption spectrum of the perovskite/Si tandem solar cell. The SGA emission occurs in a range of 450 nm to 660 nm and may be used by the perovskite layer. Therefore, this commercial phosphor serves as a down-conversion material for the perovskite/Si tandem solar cell.

To systematically examine the effects of a phosphor on the optical properties of an ARC film, a series of composite films only having the SGA phosphor with five volume concentrations (0%, 0.4%, 0.8%, 1.2%, and 1.6%) was prepared. The films are indicated as ARC, ARC_SGA (0.4), ARC_SGA (0.8), ARC_SGA (1.2), and ARC_SGA (1.6), respectively. FIGS. 2B to 2D show a total transmittance, a diffuse transmittance, and a reflectance of the ARC_SGA film on glass. FIGS. 2E and 2F show, as a function of volume concentration, a PCE and an IPCE of the perovskite/Si tandem solar cell device with the ARC film.

Devices with and without the ARC film exhibit Jsc of 14.70 and 16.02 mA $cm^{-2}$, Voc of 1.75 and 1.75 V, and FF of 80.23% and 80.18%.

As a result, the PCE is improved from 20.64% to 22.48%. The textured surface of the pure PDMS film (ARC) contributes to reducing the reflectance and confining incident light. Applying ARC_SGA (0.4) to the device increases Jsc and PCE to 16.21 mA $cm^{-2}$ and 22.75%, respectively. The IPCE curve of FIG. 2F clearly shows that the addition of SGA increases the IPCE in the UV region by using UV light which has a parasitic absorption problem.

A small amount of SGA increases the IPCE in a visible range. The total transmittance of ARC_SGA (0.4) is slightly lower than that of ARC, but ARC_SGA (0.4) slightly increases the diffuse transmittance in the visible range and improves the IPCE. However, as the volume concentration of SGA increases, the PCE of the device decreases. This is because the high refractive index (n≈1.7-1.9) and the larger size (diameter≈5 μm) of SGA reduce the total transmittance (see FIG. 2B). Since the size of the SGA particles is larger than a wavelength of incident light, SGA also contributes to increasing backward scattering at an SGA-PDMS interface and reducing the diffuse transmittance (see FIG. 2C).

The results shown in FIGS. 2A to 2F suggest that SGA may convert UV light into electricity without the parasitic absorption problem. However, it increases the reflectance and thus reduces the total current of the solar cell. For high-performance solar cells, backward scattering of visible and NIR light needs to be suppressed.

FIGS. 3A to 3F show results of analyzing an increase in efficiency of a photoelectric device by the introduction of $SiO_2$ nanopowder.

Figure 3A:
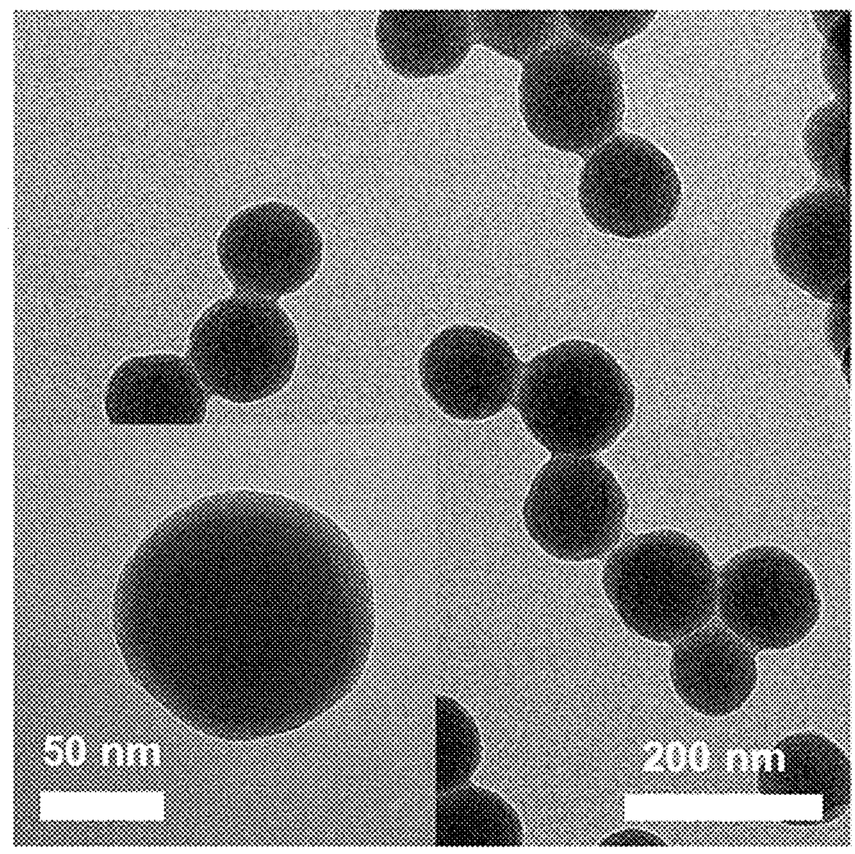
FIG. 3A is an SEM image of $SiO_2$ nanoparticles.
Figure 3B:
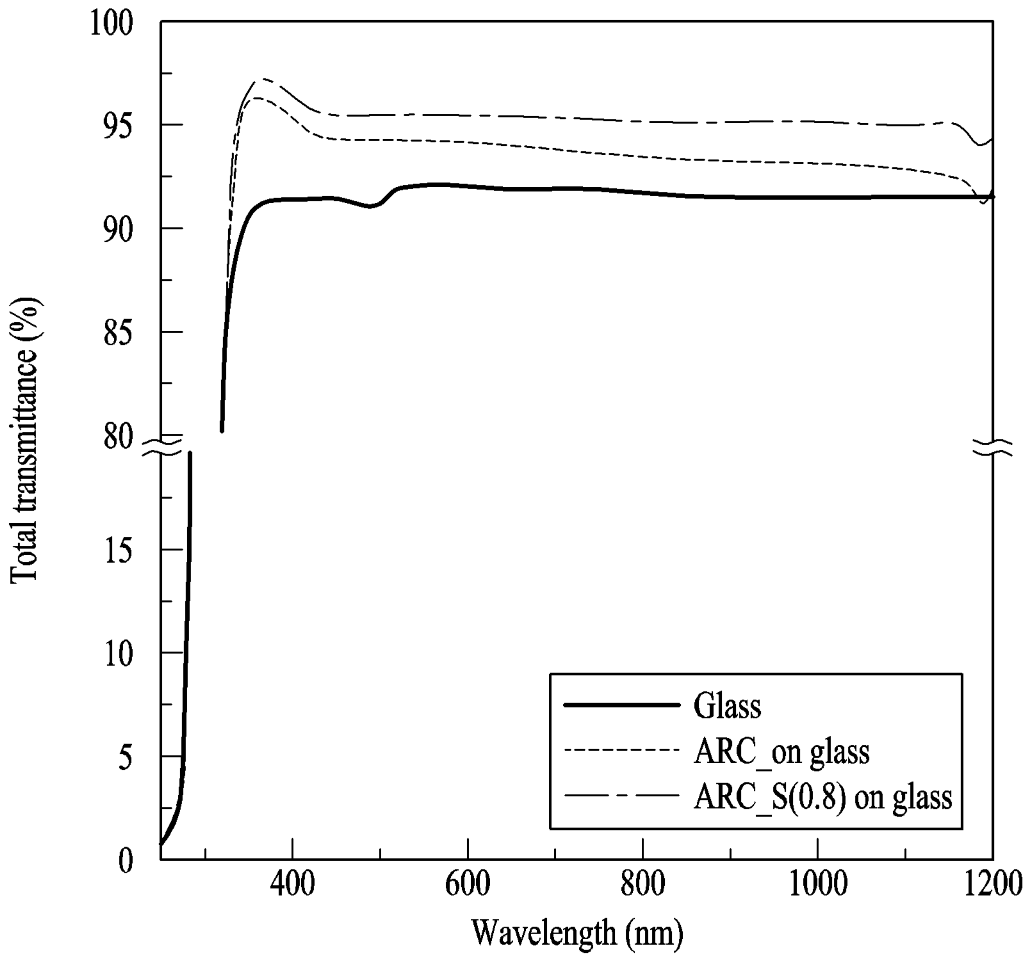
FIG. 3B is a diagram showing a total transmittance.
Figure 3C:
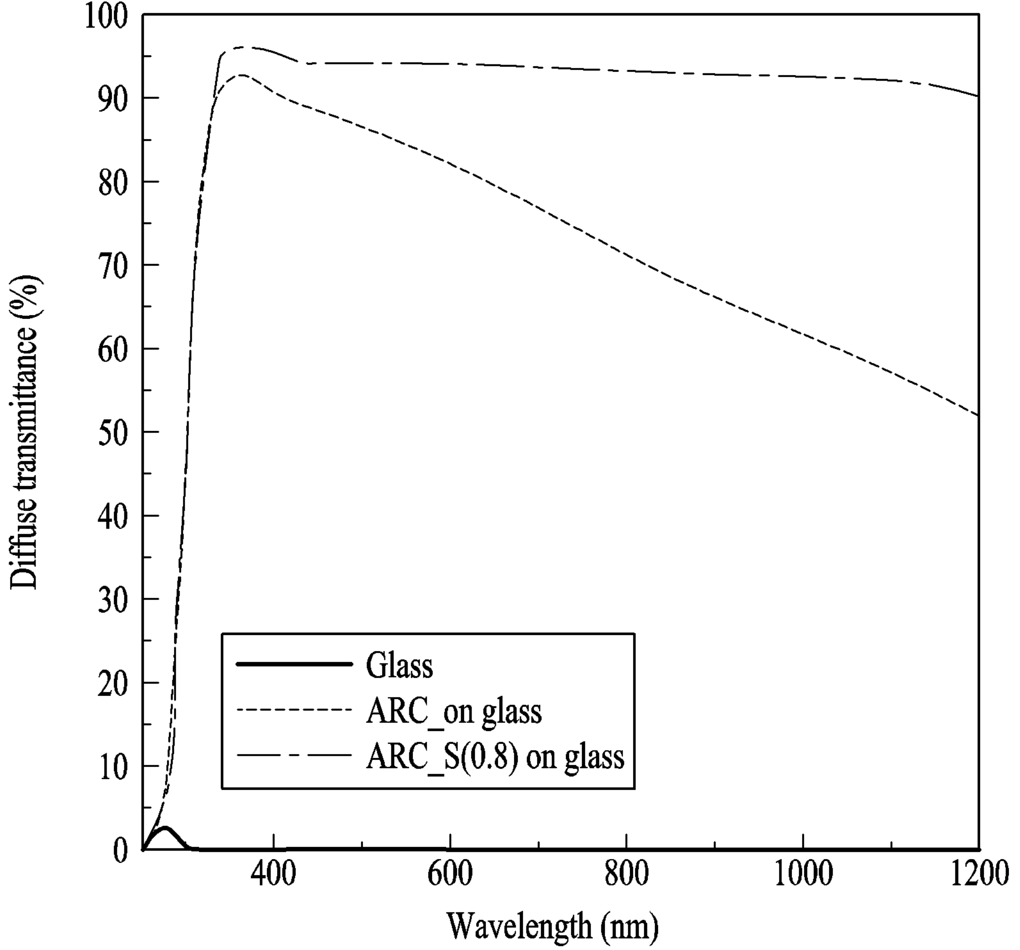
FIG. 3C is a diagram showing a diffuse transmittance.
Figure 3D:
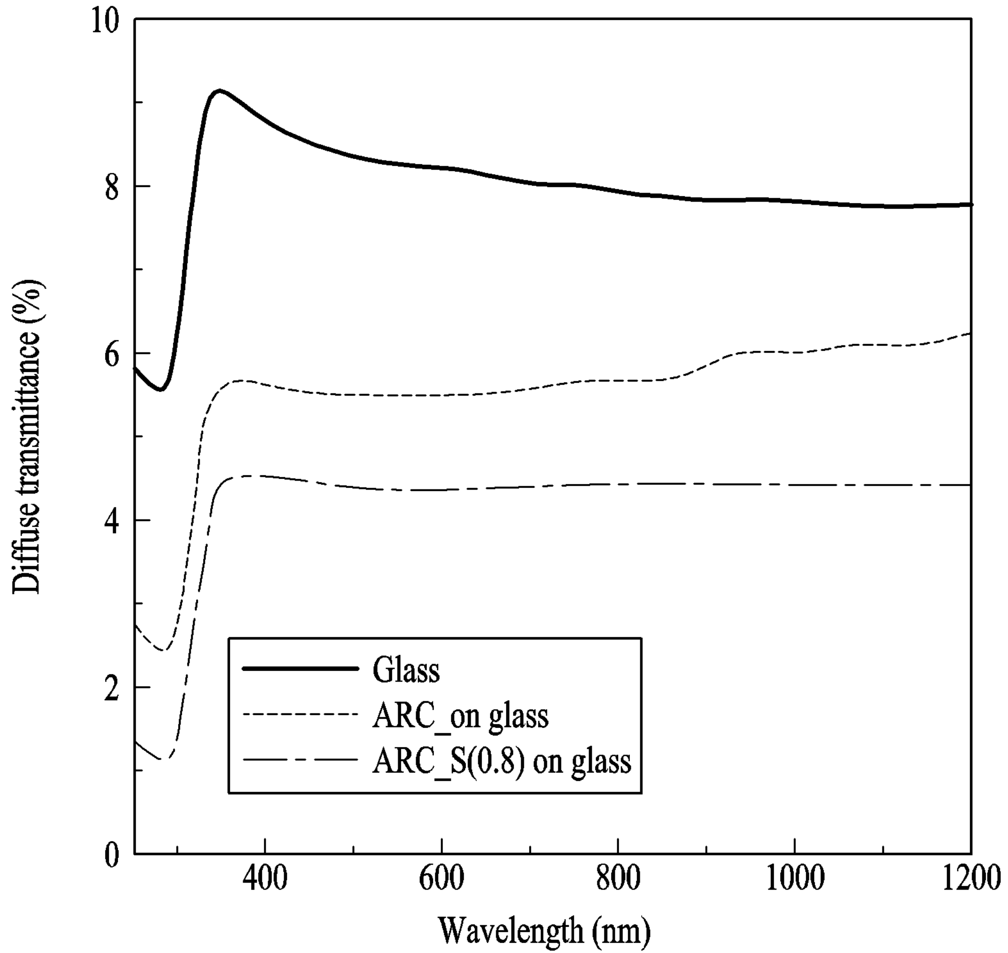
FIG. 3D is a diagram showing reflectance of textured ARC_S (0.8) on glass, a textured ARC film on glass, and glass.
Figure 3E:
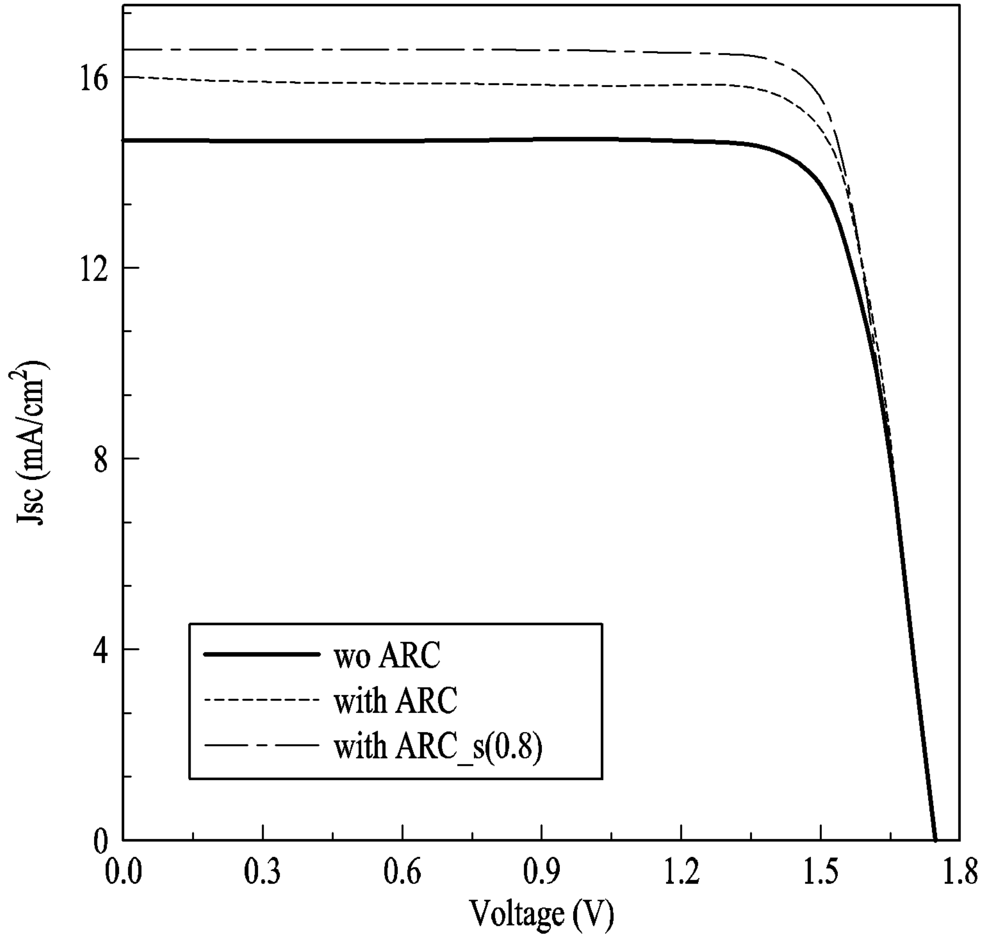
FIG. 3E is a diagram showing a J-V curve of a tandem solar cell with and without the same film.
Figure 3F:
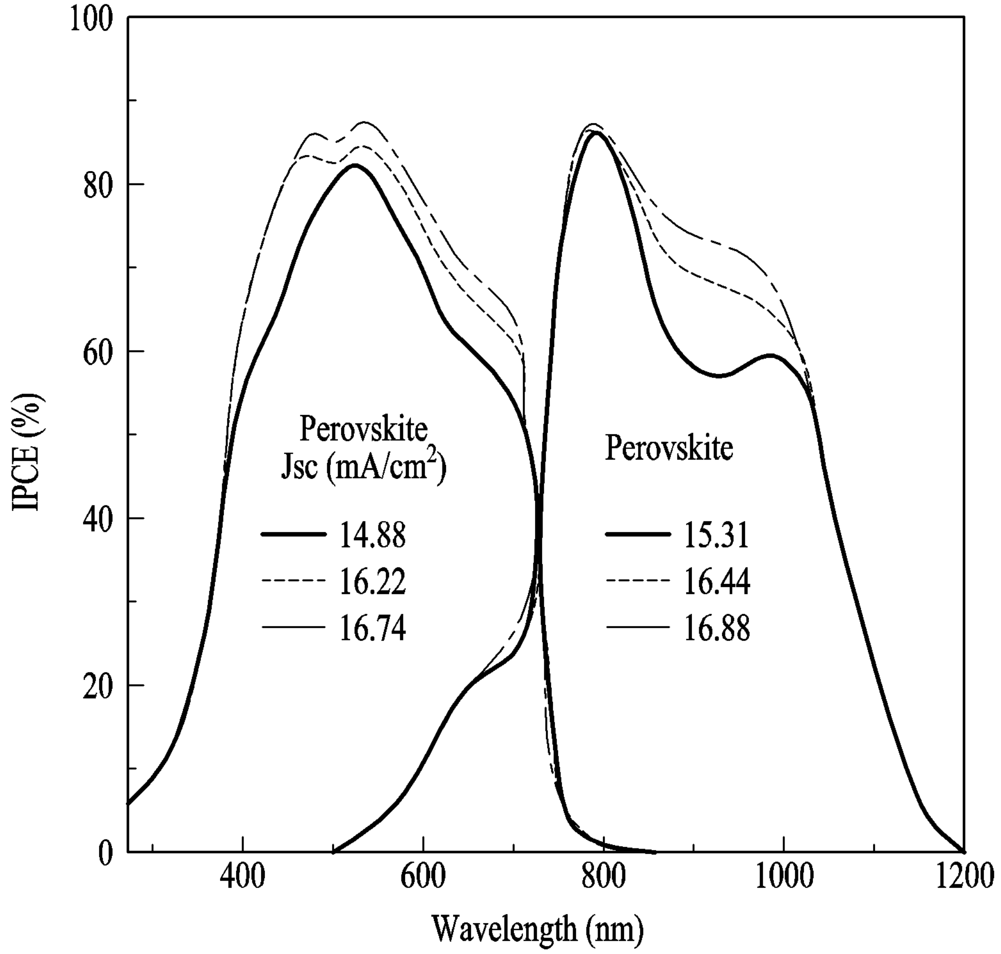
FIG. 3F is a diagram showing an IPCE curve.

FIG. 3A is an SEM image of $SiO_2$ nanoparticles, FIG. 3B is a diagram showing a total transmittance, and FIG. 3C is a diagram showing a diffuse transmittance. FIG. 3D is a diagram showing reflectance of textured ARC_S (0.8) on glass, a textured ARC film on glass, and glass. FIG. 3E is a diagram showing a J-V curve of a tandem solar cell with and without the same film, and FIG. 3F is a diagram showing an IPCE curve.

To solve this problem, $SiO_2$ spherical nanoparticles with a diameter of 100 nm shown in FIG. 3A were added to the ARC film and the forward scattering power was applied. Because a difference in refractive index between $SiO_2$ (n≈1.46) and PDMS (n≈1.39) is small, and due to their spherical shape and small size, the addition of $SiO_2$ nanoparticles is expected to enhance the forward scattering of incident light without any optical loss.

The diagrams show the total transmittance of $SiO_2$ particles in glass as a function of size at the same volume concentration (0.8 vol. %). The total transmittance of $SiO_2$ particles with a size of 30 nm in glass is lower than that of glass. As the nanoparticle size increases to 100 nm, the total reflectance also increases. This is because the increase in nanoparticle size increases a forward scattering power/backward scattering power ratio in the Mie scattering method. However, as the particle size is closer to the wavelength of incident light, the incident light starts to be reflected. This is the case for the $SiO_2$ particles with a diameter of 340 nm and 1300 nm. That is, the transmittance decreases again due to the reflectance. Therefore, the $SiO_2$ nanoparticles with a diameter of 100 nm are selected to increase the forward scattering of the ARC film. The textured PDMS film containing 0.8 vol. % of the 100 nm $SiO_2$ nanoparticles is indicated as ARC_S (0.8). FIGS. 3B to 3D show the total transmittance, diffuse transmittance, and reflectance of ARC and ARC_S (0.8). Unlike SGA, the $SiO_2$ nanoparticles (0.8 vol. %) slightly increase the transmittance of ARC. The total reflectance of ARC_S (0.8) is lower than that of ARC, which is more prominent in an NIR region.

This is because the $SiO_2$ nanoparticles increase the diffuse transmittance through multi-scattering. As shown in FIG. 3C, a difference in diffuse transmittance between ARC and ARC_S (0.8) becomes more prominent as the wavelength increases. Therefore, the reflectance of ARC_S (0.8) is lower than that of ARC (see FIG. 3D). The average reflectance in UV, vis, and NIR regimes is 5.6% for ARC and 4.4% for ARC_S (0.8). The current obtained by integrating the reflectance (i.e., return loss) decreases from 2.48 (ARC) to 1.92 mA $cm^{-2}$ (ARC_S (0.8)).

FIG. 3E shows the effects of ARC and ARC_S (0.8) on the performance of the perovskite/silicon tandem solar cell. Compared to PCE (20.64%) of a control sample without ARC, PCEs of devices with ARC and ARC_S (0.8) are 22.48% and 23.26%, respectively. This is because Jsc increased by 0.56 mA $cm^{-2}$. FIG. 3F shows that adding 100 nm $SiO_2$ nanoparticles increases the IPCE over an entire range and this improvement is more prominent in the NIR region where a diffuse transmittance accounts for >90% of a total transmittance. This decreases the reflectance and increases the effective thickness of a light absorber (e.g., the perovskite layer and the Si layer) to facilitate the electrical conversion of incident photons.

Figure 4A:
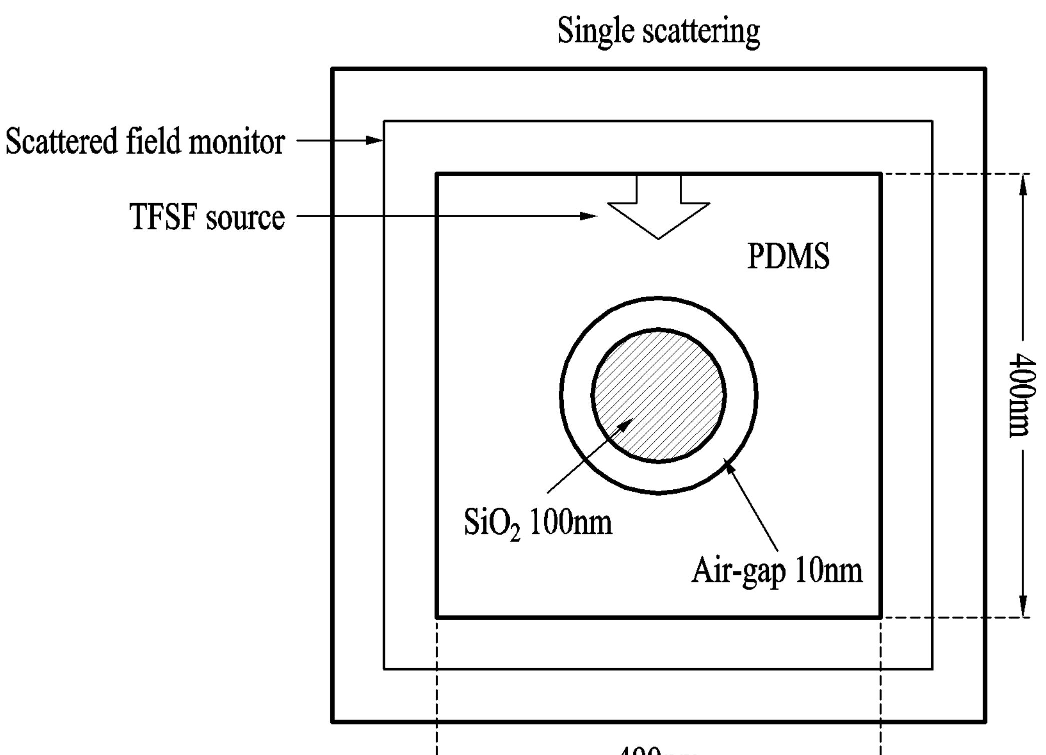
FIG. 4A is a schematic diagram showing a finite-difference time-domain (FDTD) simulation setup for a single particle ($SiO_2$@Air) scattering (or single-scattering) model and a multi-scattering model, in which, for the single-scattering model, $SiO_2$ particles of the size of 100 nm with a 10 nm air gap ($SiO_2$@Air) are added as a scatterer to a PDMS matrix (0.8 vol. %), and for the multi-scattering model, 729 $SiO_2$@Air particles are randomly distributed onto PDMS with the same volume %, and refractive indices of PDMS and $SiO_2$ are 1.39 and 1.46, respectively, at 623 nm.
Figure 4A:
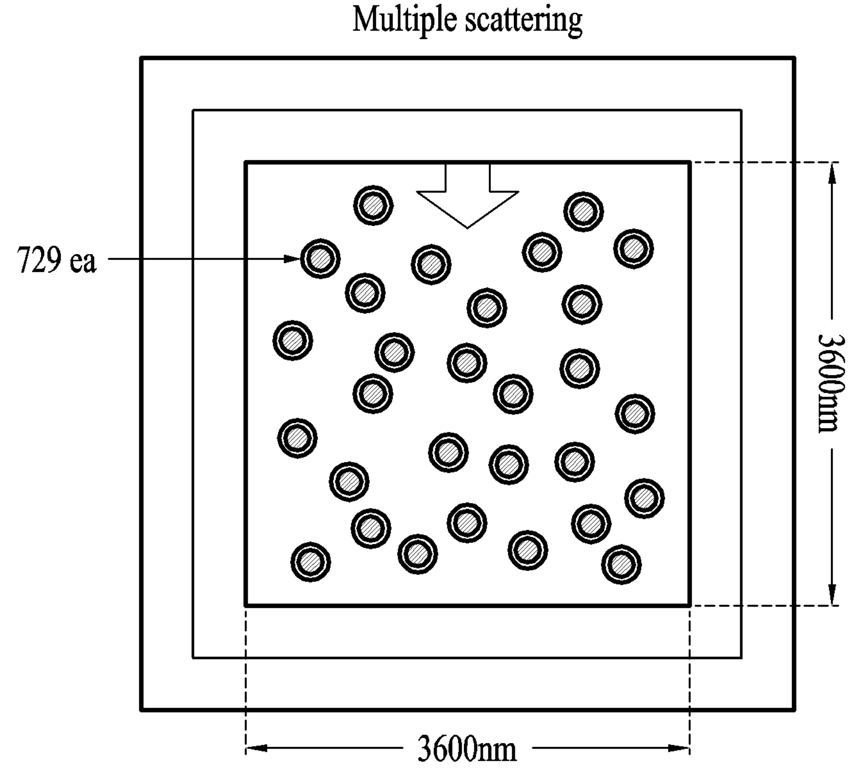
Figure 4B:
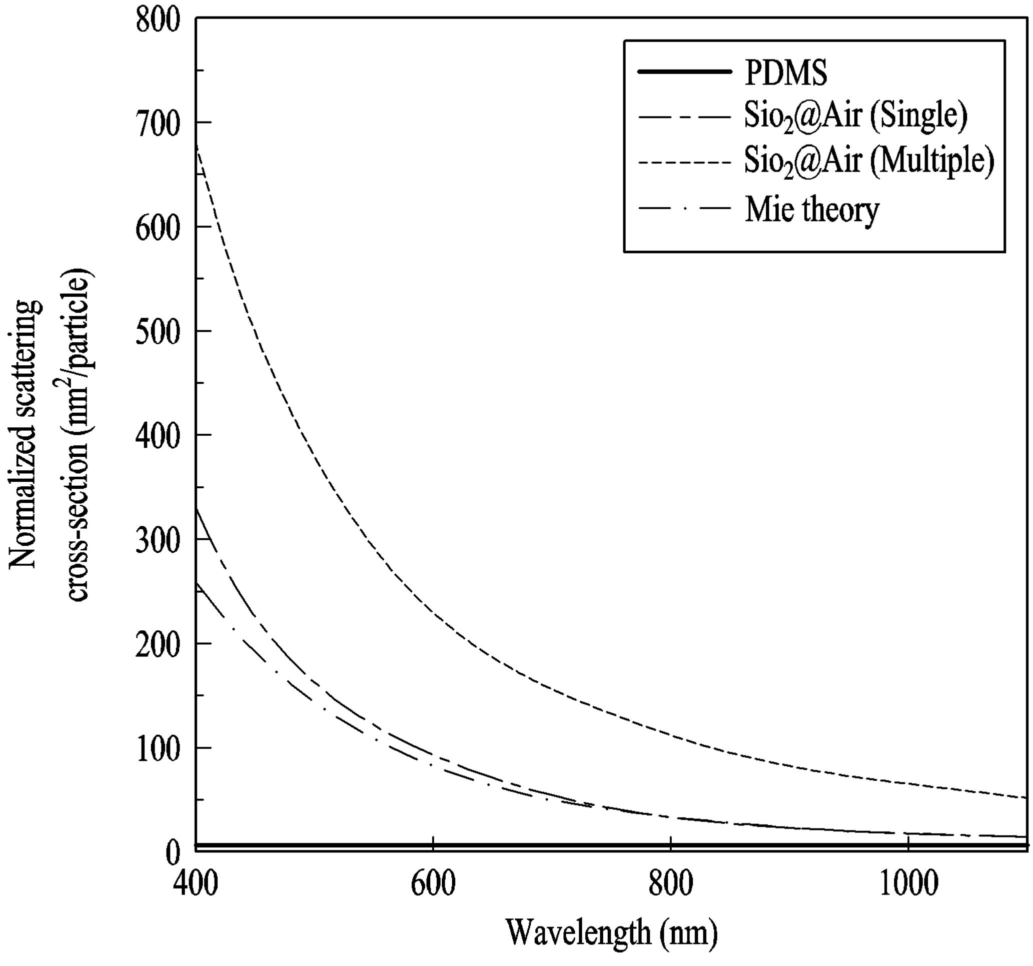
FIG. 4B is a diagram showing cross sections of normalized scattering for PDMS only, single-scattering of $SiO_2$@Air, and multi-scattering of a $SiO_2$@Air system.
Figure 4C:
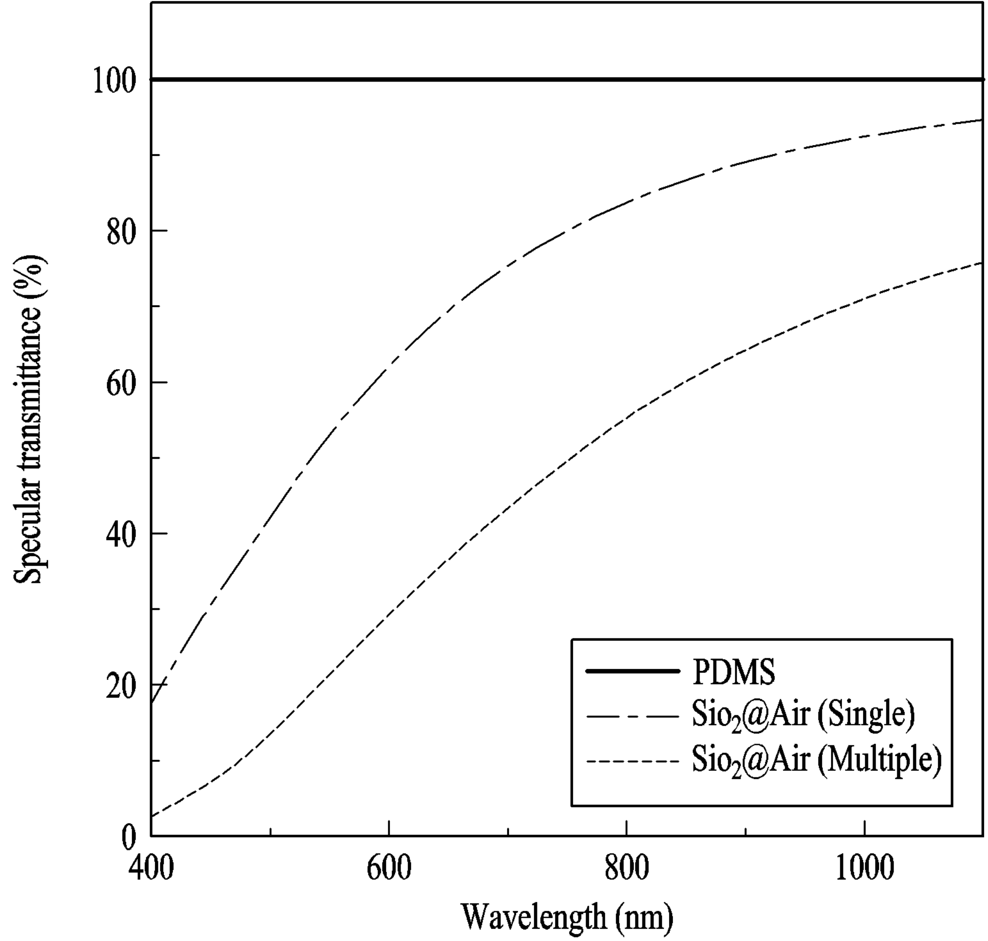
FIG. 4C is a diagram showing an estimated specular transmittance for a 150 μm-thick film based on a scattering cross section result (however, air/PDMS and PDMS/substrate interface conditions are not considered).

FIG. 4A is a schematic diagram showing a finite-difference time-domain (FDTD) simulation setup for a single particle scattering (or single-scattering) model (SiO2@Air) and a multi-scattering model. For the single-scattering model, $SiO_2$ particles of a size of 100 nm with a 10 nm air gap (SiO2@Air) are added as a scatterer to a PDMS matrix (0.8 vol. %). For the multi-scattering model, 729 SiO2@Air particles are randomly distributed onto the PDMS with the same volume %. Refractive indices of PDMS and $SiO_2$ are 1.39 and 1.46, respectively, at 623 nm. FIG. 4B is a diagram showing cross sections of normalized scattering for PDMS only, single-scattering of SiO2@Air, and multi-scattering of a SiO2@Air system. FIG. 4C is a diagram showing an estimated specular transmittance for a 150 um-thick film based on a scattering cross section result. However, air/PDMS and PDMS/substrate interface conditions are not considered here.

To better understand the diffuse scattering observed as shown in FIG. 3C, a 3D FDTD simulation was performed on the scattering effect, and a diffuse transmittance and a specular transmittance were separated. To estimate the multi-scattering effect on the diffuse transmittance of red and NIR light, two models are used. A schematic diagram of these two models is shown in FIG. 4A. For the single-scattering model, spherical $SiO_2$ particles with a size of 100 nm are added through scattering to the PDMS matrix.

The refractive indices of PDMS and $SiO_2$ are 1.39 and 1.46, respectively, at 623 nm and the extinction coefficient is negligible in a simulated wavelength region. Since the observed scattering effect is significantly larger than that calculated using a difference in refractive index between PDMS and $SiO_2$, it was assumed that the $SiO_2$ interface was not perfect. Therefore, under the assumption that the PDMS-$SiO_2$ interface is not perfectly matched, a thin air gap with a thickness of 10 nm is added between PDMS and $SiO_2$.

For the multi-scattering model, the system is stretched nine times along the x, y, and z directions and 729 $SiO_2$@Air particles are randomly distributed onto PDMS with the same ratio of 0.8 vol. %. FIG. 4B shows a scattering cross section calculated through the normalization of the scattering power to a source intensity. The normalized cross section of multi-scattering is obtained by dividing the calculated value by the number (e.g., 729) of particles included in the simulation. Comparing it with the single-scattering effect may enable comparison with an actual multi-scattering effect.

As shown in FIG. 4B, the calculated single scatterer effect matches the prediction of the Mie scattering theory. As the number of scatterers increases, the scattering cross-sectional area increases rapidly, which is more prominent in a long wavelength range. The relative integral increases by 113% at 2=400 nm, by 213% at λ=750 nm, and by 319% at λ=1100 nm. As a result, a specular reflection transmittance of the multi-scattering system becomes much smaller than that of the single-scattering system in the red and NIR regions. FIG. 4C shows that the specular reflection transmittance decreases from about 100% (only PDMS) to about 70% (PDMS+$SiO_2$ NPs) for red and NIR light, when multi-scattering is considered in the simulation process. A 30% decrease in specular transmittance by the embedded $SiO_2$ NPs may be verified from the diffuse transmittance experimentally observed as shown in FIG. 3C.

Figure 5A:
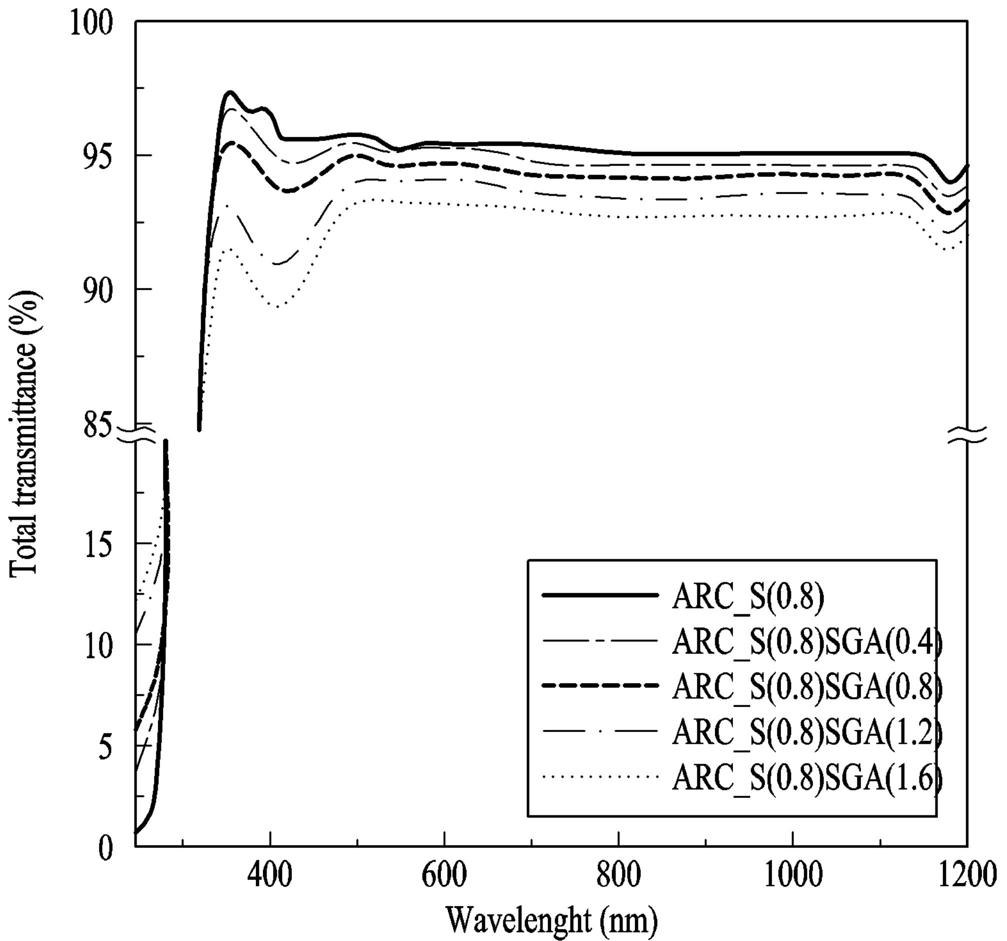
FIG. 5A is a diagram showing a total transmittance of ARC_S (0.8) having different volume % (0.4, 0.8, 1.2, 1.6%) of an SGA phosphor (ARC_S (0.8), ARC_S (0.8) SGA (0.4), ARC_S (0.8) SGA (0.8), ARC_S (0.8) SGA (1.2), and ARC_S (0.8) SGA (1.6))
Figure 5B:
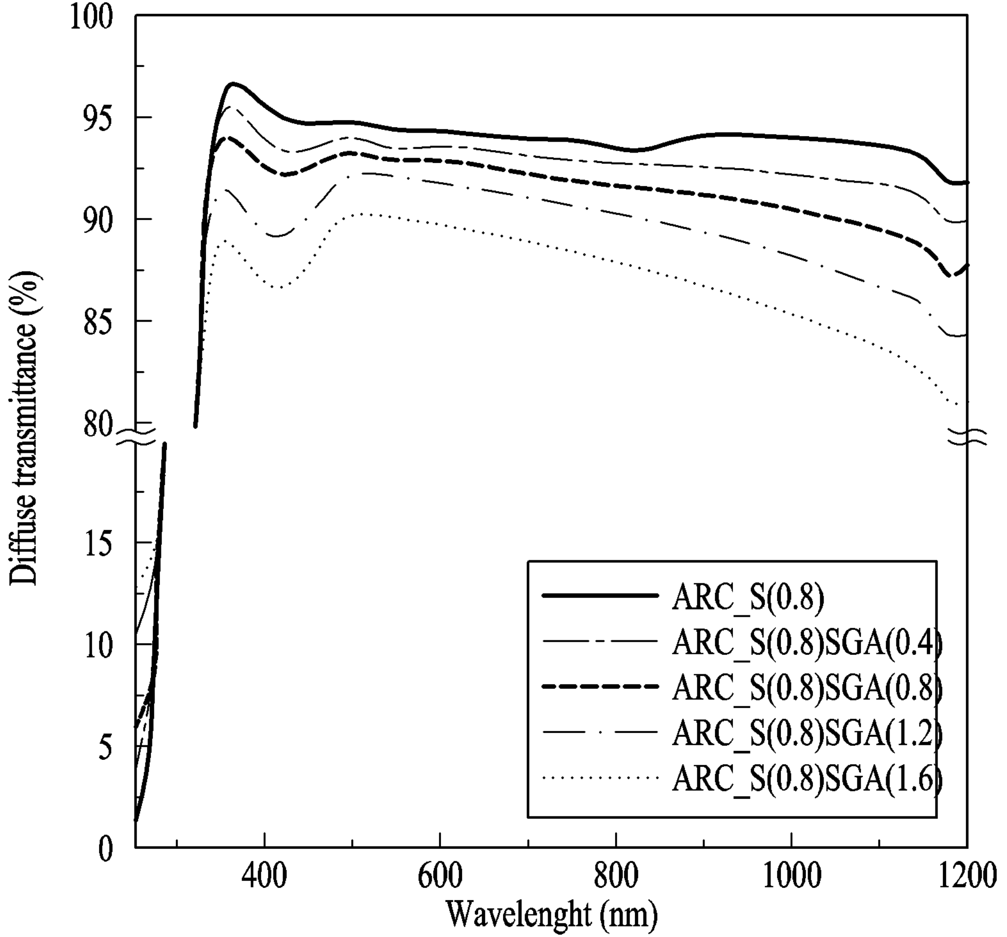
FIG. 5B is a diagram showing a diffuse transmittance.

To combine a down-conversion effect and the increased forward scattering, SGA particles and 100 nm $SiO_2$ nanoparticles are added together to an ARC film. FIGS. 5A and 5B show a total transmittance and a diffuse transmittance of an ARC film including both the SGA phosphors and the $SiO_2$ nanoparticles. Four SGA volume concentrations (0.4, 0.8, 1.2 and 1.6 vol. %) were selected, which are indicated as ARC_S (0.8) SGA (0.4), ARC_S (0.8) SGA (0.8), ARC_S (0.8) SGA (1.2), and ARC_S (0.8) SGA (1.6). Comparing what is shown in FIG. 2 and in FIG. 5, the addition of $SiO_2$ NPs to ARC_SGA increases both the total transmittance and the diffuse transmittance.

This is consistent with the simulation results shown in FIGS. 4A and 4B and shows the enhanced diffuse transmittance by the $SiO_2$ NPs. The multi-scattering of incident light by the $SiO_2$ nanoparticles suppresses the reflectance and increases the diffuse transmittance. Compared to ARC, ARC_S (0.8) SGA (0.8) exhibits a much greater diffuse transmittance in the NIR region and similar reflectance in the visible region, as shown in FIG. 5B.

Figure 5C:
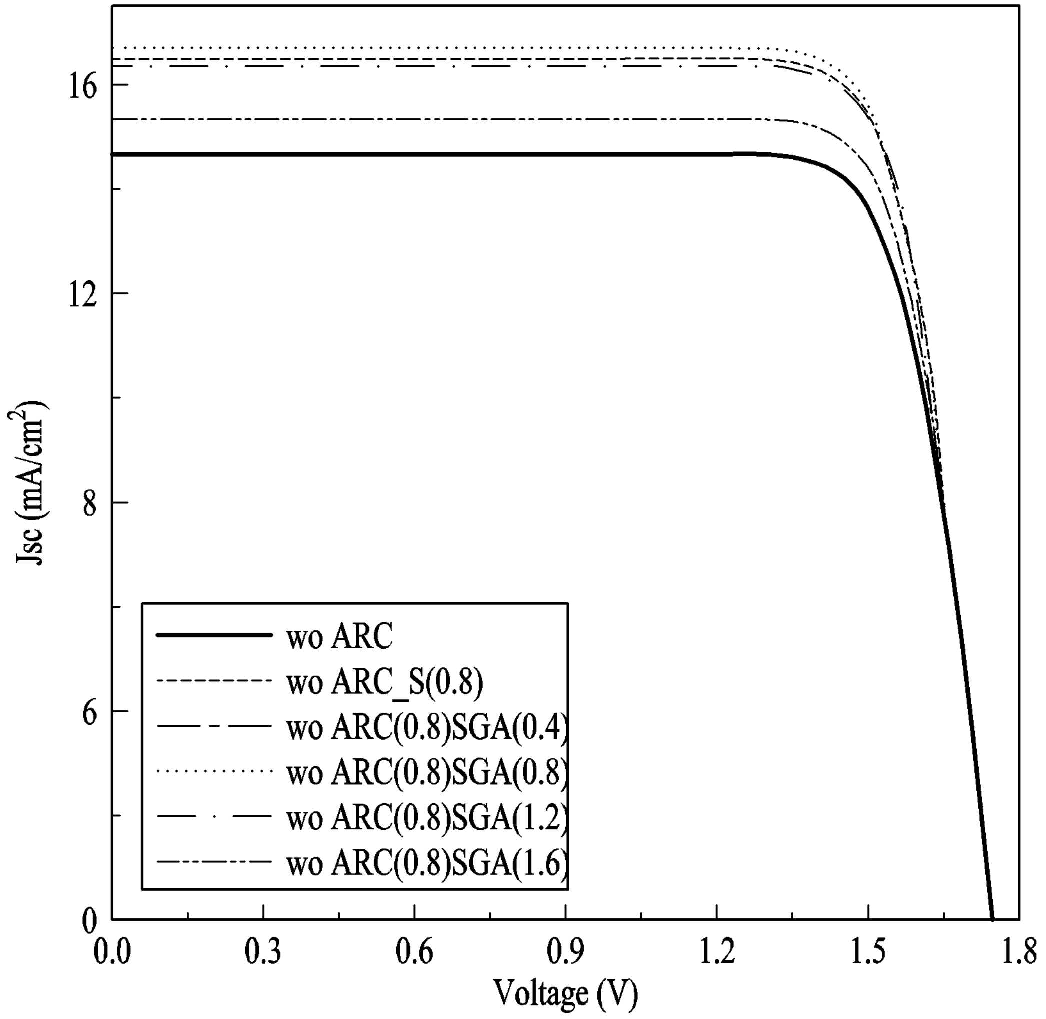
FIG. 5C is a diagram showing a J-V curve of a tandem solar cell with or without an antireflective coating film of SGA and $SiO_2$ nanoparticles.
Figure 5D:
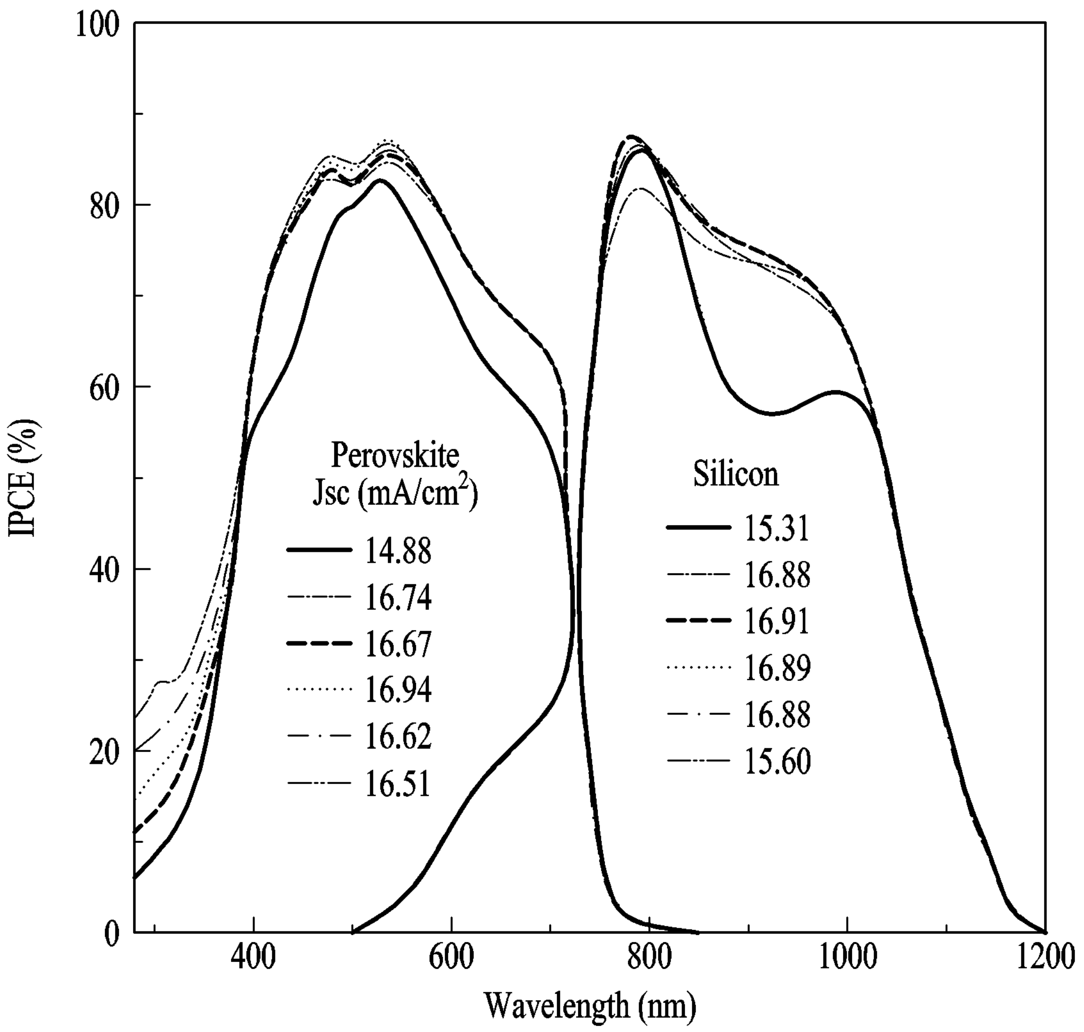
FIG. 5D is a diagram showing an IPCE.
Figure 5E:
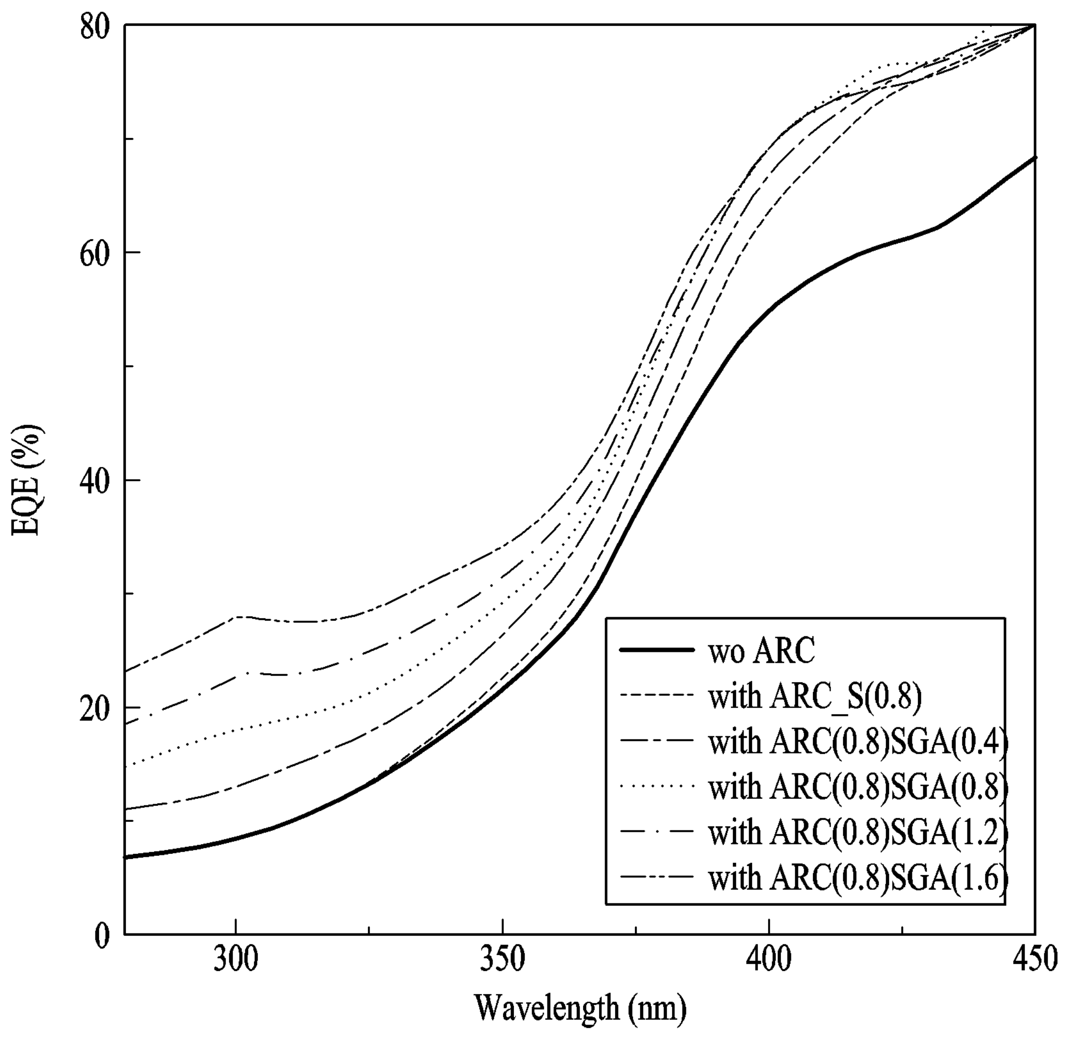
FIG. 5E is a diagram showing an enlarged IPCE spectrum below 450 nm of a tandem solar cell with ARC_S (0.8) SGA (0.8)
Figure 5F:
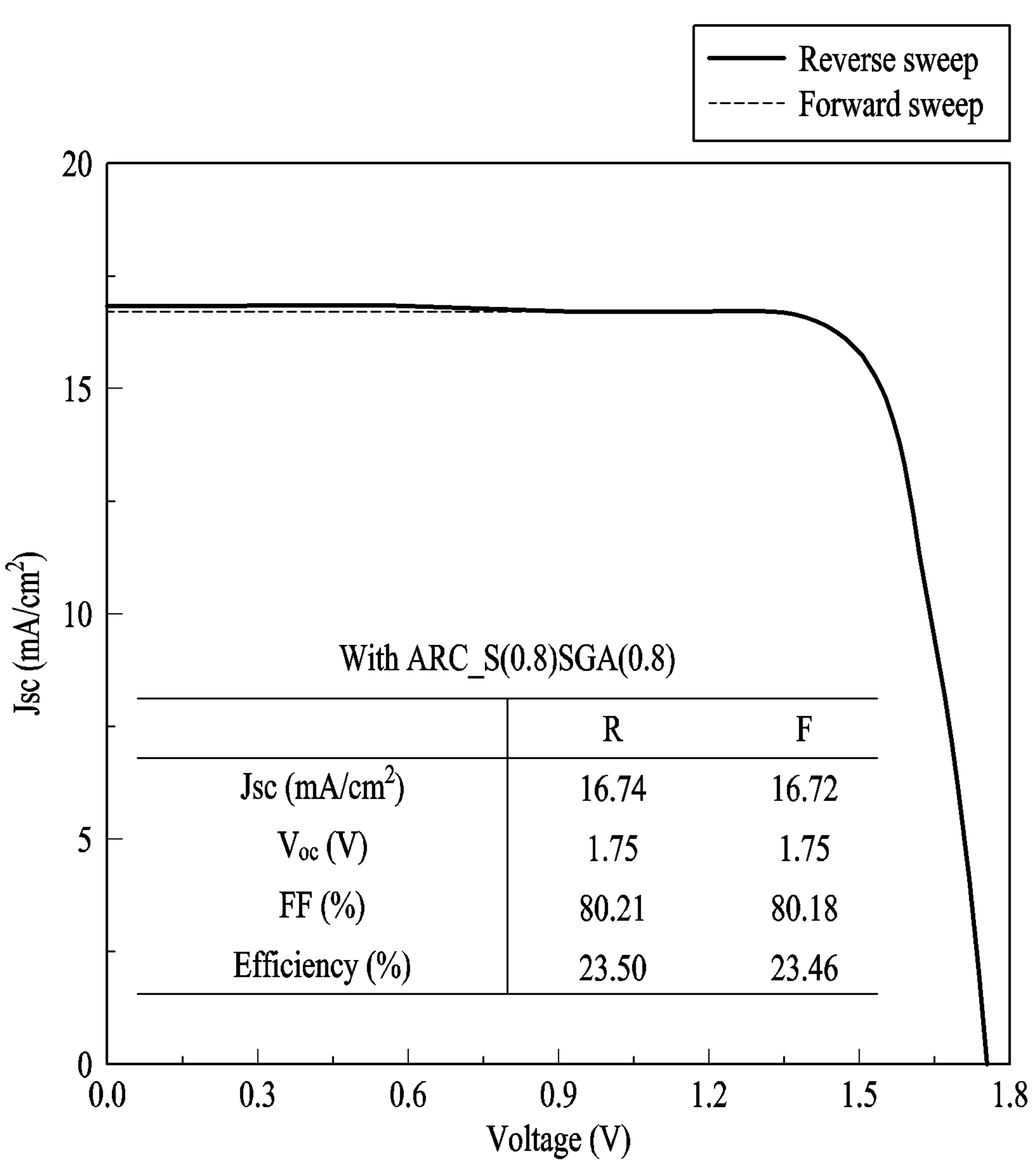
FIG. 5F is a diagram showing hysteresis.

This suggests that the $SiO_2$ NPs may compensate for the backward scattering of large SGA particles. FIGS. 5C and 5D show JV and IPCE curves of tandem solar cells with different antireflective coating films. The perovskite/Si tandem solar cell with the ARC_S (0.8) SGA (0.8) film exhibits Jsc of 16.74 mA $cm^{-2}$, Voc of 1.75 V, and FF of 80.21%, without hysteresis, as shown in FIG. 5F.

The PCE of the tandem solar cell with ARC_S (0.8) SGA (0.8) is 23.50%, whereas the PCE of the tandem solar cell with ARC_S (0.8) is 23.26%. Such a change in PCE is because the down-conversion of UV light (280 nm$<\lambda<$430 nm) by SGA increases Jsc (see FIG. 5E). In addition, UV stability may be improved by the ARC film containing the phosphors.

Figure 6B:
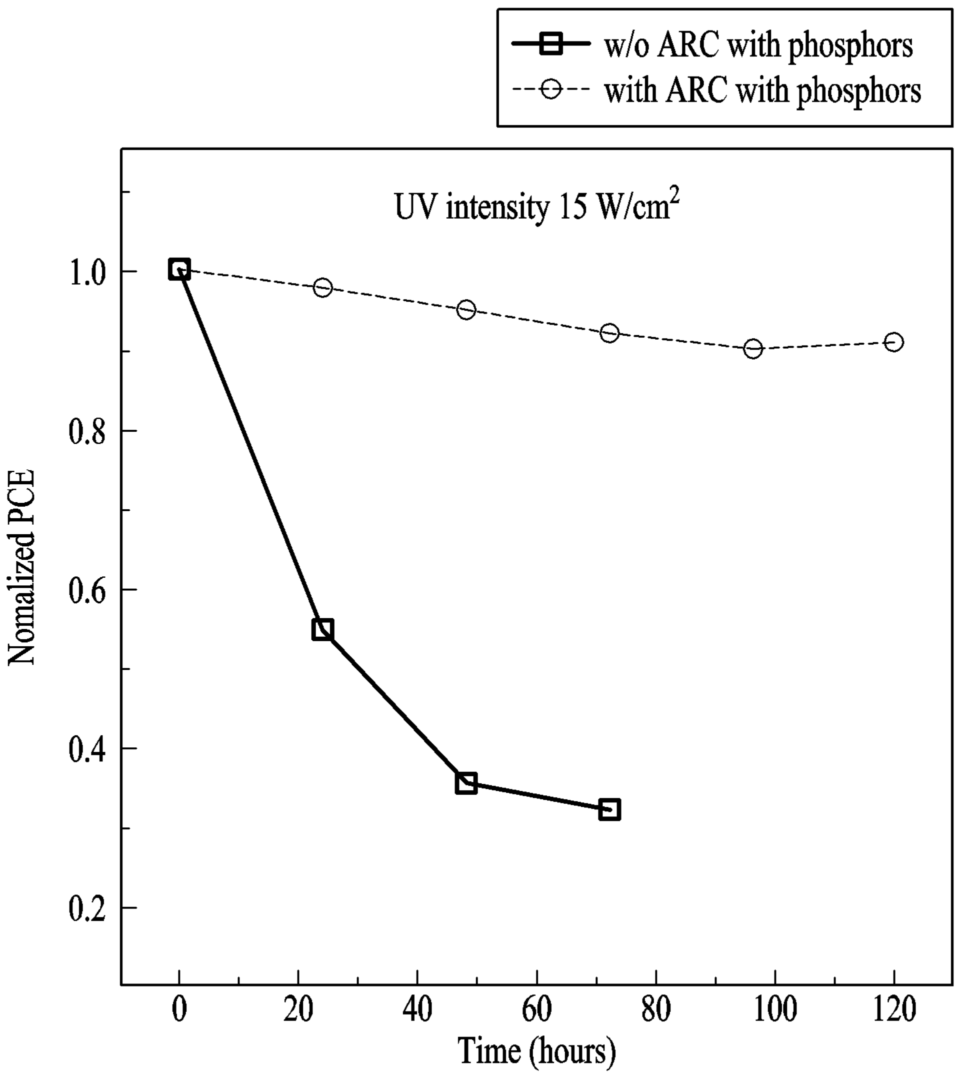
FIG. 6B is a diagram showing a normalized power conversion efficiency (PCE) of perovskite (Au/Sprio-OMeTAD/Perovskite/$TiO_2$/FTO) without ARC and phosphor-embedded ARC under continuous UV (365 nm) exposure (15 $W/cm^2$) in $N_2$.

FIG. 6B is a diagram showing a flattened PCE of a perovskite solar cell of an Au/Spiro-OMeTAD/Perovskite/$TiO_2$/FTO structure with a phosphor-embedded ARC and with no ARC under UV (365 nm) irradiation with an irradiance of 15 W $cm^{-2}$. This is an analysis of a comparison of UV stability before and after the application of the antireflective coating film to a photoelectric device vulnerable to UV photostability.

To clearly observe the effect of UV stability on solar cell performance, the perovskite solar cell of the Au/Spiro-OMeTAD/Perovskite/$TiO_2$/FTO structure was used as shown in FIG. 6B. The UV stability of a device is improved under UV (365 nm) irradiation with an irradiance of 15 W $cm^{-2}$ by the UV down-conversion effect of the phosphors. The PCE of the device with the ARC film may be maintained for 120 hours, with 91% of its initial value maintained.

The effect of the SGA phosphors on the improvement of IPCE in the UV region is clearly observed as shown in FIG. 5D. However, when the SGA concentration is >0.8 vol. %, a loss of Jsc by the increased reflectance offsets a gain of Jsc by the down-conversion effect.

According to an embodiment of the present disclosure, embedding (Ba, Ca, Eu, $Sr)_2SiO_4$ phosphors (silicate-based green phosphors, indicated as SGA) with a micro-sized diameter (e.g., 3 μm to 10 μm) and $SiO_2$ nanoparticles with a diameter of 100 nm in a textured PDMS may convert UV light and increase a diffuse transmittance of incident light. Such a mixture of the SGA phosphors and the $SiO_2$ nanoparticles may significantly reduce reflectance while suppressing parasitic absorption of the UV light. This is because down-conversion by the SGA particles reduces UV absorption, and multi-scattering of the embedded nanoparticles (e.g., $SiO_2$ nanoparticles) maximizes forward scattering power. Therefore, the PDMS-nanoparticle composite of the textured shape may successfully enhance the performance of a perovskite/Si tandem solar cell. Compared to a pure PDMS texture film, such a textured PDMS-phosphor-$SiO_2$ nanoparticle composite may increase PCE of the perovskite/Si tandem solar cell from 22.48% to 23.50%.

According to an embodiment of the present disclosure, a combination of $SiO_2$ nanoparticles and micro-sized large phosphor particles may convert UV light into visible light and increase a total transmittance of an ARC film. The large phosphor particles included in PDMS-ARC may cause down-conversion of UV light and increase a diffuse reflectance, but adding a small amount of $SiO_2$ nanoparticles may compensate for backward scattering of the large phosphor particles through multi-scattering and improve a diffuse transmittance particularly in a long wavelength (e.g., in red and NIR regions). Such optical engineering of PDMS-ARC using the embedded particles may increase the PCE of perovskite/Si tandem solar cells. Such an improvement in PCE may be attributed to an increase in JSC by suppression of reflectance and down-conversion of UV light.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

The invention claimed is:

1. A polymeric antireflective coating film, comprising:

a transparent polymer; and micro phosphor particles and oxide nanoparticles mixed within the transparent polymer, wherein a textured surface of a three-dimensional (3D) structure has a micro pyramid texture shape and is comprised on at least one side and the 3D structure contains the transparent polymer, micro phosphor particles, and oxide nanoparticles and wherein the micro pyramid texture shape has a width and a height of greater than 1 to 5 μm.

2. The polymeric antireflective coating film of claim 1, wherein the transparent polymer comprises at least one of polydimethylsiloxane (PDMS), polydiphenylsiloxane (PDPhS), polymethylphenylsiloxane (PMPS), ethylene-vinyl acetate copolymer (EVA), poly olefin elastomer (POE), polymethyl metacrylate (PMMA), cellulose triacetate (TAC), polyethylene terephthalate (PET), poly(ether ketone) (PEK), polymer glass, polycarbonate (PC), and polyolefin, or a combination thereof.

3. The polymeric antireflective coating film of claim 1, comprising:

a protrusion, a recess, or both by the 3D structure on the at least one side of the polymeric antireflective coating film.

4. The polymeric antireflective coating film of claim 1, wherein the micro phosphor particles and the oxide nanoparticles are collectively up to 6% by weight of the polymeric antireflective coating film.

5. The polymeric antireflective coating film of claim 1, wherein a mass ratio of the micro phosphor particles to the oxide nanoparticles is 1:10 to 1:1.

6. The polymeric antireflective coating film of claim 1, wherein the micro phosphor particles comprise at least one of a red phosphor, a green phosphor, and a blue phosphor, or a combination thereof.

7. The polymeric antireflective coating film of claim 1, wherein the micro phosphor particles comprise at least one of a silicon-based phosphor, a nitride-based phosphor, and an oxide-based phosphor, or a combination thereof.

8. The polymeric antireflective coating film of claim 1, wherein a size of the oxide nanoparticles is 30 nanometers (nm) to 400 nm.

9. The polymeric antireflective coating film of claim 1, wherein the oxide nanoparticles comprise an oxide particle having a light-scattering function, and the oxide nanoparticles comprise a light-scattering particle comprising at least one of silica, titanium oxide, magnesium oxide, barium oxide, aluminum oxide, bismuth oxide, zirconium oxide, tin oxide, tungsten oxide, strontium oxide, niobium oxide, and zinc oxide, or a combination thereof.

10. The polymeric antireflective coating film of claim 1, having a light transmittance of 90% or greater.

11. The polymeric antireflective coating film of claim 1, having a thickness of 50 μm to 300 μm.

12. A photoelectric device comprising the polymeric antireflective coating film of claim 1.

13. The photoelectric device of claim 12, comprising a perovskite solar cell, a silicon solar cell, or both.

14. The photoelectric device of claim 12, comprising:

a monolithic perovskite solar cell layer; and a silicon tandem solar cell layer, wherein the polymeric antireflective coating film is comprised on the monolithic perovskite solar cell layer.

* * * * *